(12) United States Patent
Zeng

(10) Patent No.: US 10,972,589 B2
(45) Date of Patent: *Apr. 6, 2021

(54) BRACKET STRUCTURE, INPUT/OUTPUT ASSEMBLY AND ELECTRONIC DEVICE

(71) Applicant: GUANGDONG OPPO MOBILE TELECOMMUNICATIONS CORP., LTD., Guangdong (CN)

(72) Inventor: Zanjian Zeng, Guangdong (CN)

(73) Assignee: GUANGDONG OPPO MOBILE TELECOMMUNICATIONS CORP., LTD., Guangdong (CN)

(*) Notice: Subject to any disclaimer, the term of this patent is extended or adjusted under 35 U.S.C. 154(b) by 0 days.

This patent is subject to a terminal disclaimer.

(21) Appl. No.: 17/023,589

(22) Filed: Sep. 17, 2020

(65) Prior Publication Data

US 2021/0006645 A1    Jan. 7, 2021

Related U.S. Application Data

(63) Continuation of application No. 16/428,712, filed on May 31, 2019, now Pat. No. 10,812,638.

(30) Foreign Application Priority Data

Jun. 2, 2018 (CN) .......................... 201810559996.8
Jun. 2, 2018 (CN) .......................... 201810559997.2

(51) Int. Cl.
  *H02B 1/01*  (2006.01)
  *H04M 1/02*  (2006.01)
  (Continued)

(52) U.S. Cl.
  CPC ........ *H04M 1/0249* (2013.01); *G06F 1/1633* (2013.01); *H04M 1/0277* (2013.01); *H05K 7/1401* (2013.01)

(58) Field of Classification Search
  USPC ......................................................... 361/825
  See application file for complete search history.

(56) References Cited

U.S. PATENT DOCUMENTS

| 8,363,391 B2 | 1/2013 | Kim et al. |
| 10,484,582 B2 | 11/2019 | Chen et al. |

(Continued)

FOREIGN PATENT DOCUMENTS

| CN | 101938536 | 1/2011 |
| CN | 205265787 | 5/2016 |

(Continued)

OTHER PUBLICATIONS

SIPO, First Office Action for CN Application No. 201810559996.8, dated Nov. 25, 2019.

(Continued)

*Primary Examiner* — Hung S. Bui
(74) *Attorney, Agent, or Firm* — Hodgson Russ LLP

(57) ABSTRACT

An electronic device, an input/output assembly and a bracket structure are provided. The bracket structure includes a first bracket. The first bracket includes a first face, a second face and a third face. The first face and the second face are arranged on two opposite sides of the first bracket. The third face is connected to the first face and the second face. The second face is provided with at least two accommodating chambers. The first face is provided with at least two through holes corresponding to the at least two accommodating chambers. The third face is provided with a mounting hole passing through the first face and the second face. The mounting hole is arranged between two of the at least two accommodating chambers.

20 Claims, 14 Drawing Sheets

(51) Int. Cl.
*H05K 7/14* (2006.01)
*G06F 1/16* (2006.01)

(56) References Cited

U.S. PATENT DOCUMENTS

| | | | |
|---|---|---|---|
| 10,812,638 B2 * | 10/2020 | Zeng | .................... H04M 1/026 |
| 2007/0060198 A1 | 3/2007 | Kuo | |
| 2015/0168807 A1 | 6/2015 | Chao | |
| 2016/0255182 A1 | 9/2016 | Lee et al. | |
| 2016/0352982 A1 | 12/2016 | Weaver et al. | |
| 2017/0364172 A1 | 12/2017 | Kim et al. | |
| 2018/0077272 A1 | 3/2018 | Sainvil | |
| 2018/0176346 A1 | 6/2018 | Wei et al. | |
| 2018/0176426 A1 | 6/2018 | Wei et al. | |
| 2019/0373153 A1 | 12/2019 | Zeng et al. | |

FOREIGN PATENT DOCUMENTS

| | | |
|---|---|---|
| CN | 105847651 | 8/2016 |
| CN | 106603765 | 4/2017 |
| CN | 206674128 | 11/2017 |
| CN | 107483692 | 12/2017 |
| CN | 107483797 | 12/2017 |
| CN | 107483800 | 12/2017 |
| CN | 206698329 | 12/2017 |
| CN | 206948466 | 1/2018 |
| CN | 107911584 | 4/2018 |
| CN | 107948468 | 4/2018 |
| CN | 108712533 | 10/2018 |
| CN | 108848210 | 11/2018 |

OTHER PUBLICATIONS

WIPO, ISR for PCT/CN2019/080726, dated May 29, 2019.
EPO, Extended European Search Report for EP Application No. 19177619.4, dated Aug. 20, 2019.
EPO, Communication for EP Application No. 19177619.4, dated Mar. 24, 2020.
SIPO, First Office Action for CN Application No. 201810559997.2, dated Aug. 30, 2019.
SIPO, Second Office Action for CN Application No. 201810559997.2, dated Nov. 15, 2019.
USPTO, Office Action for U.S. Appl. No. 16/428,712, dated Mar. 13, 2020.
IPI, Office Action for IN Application No. 201914021778, dated Sep. 30, 2020.

* cited by examiner

BRACKET STRUCTURE, INPUT/OUTPUT ASSEMBLY AND ELECTRONIC DEVICE

CROSS-REFERENCE TO RELATED APPLICATIONS

This application is a continuation of U.S. application Ser. No. 16/428,712, filed May 31, 2019, which claims priority to Chinese Patent Applications No. 201810559997.2 and 201810559996.8, each filed Jun. 2, 2018, the entire disclosures of which are incorporated herein by reference.

FIELD

The present disclosure relates to a field of consumption electronics, and more particularly, to a bracket structure, an input/output assembly and an electronic device.

BACKGROUND

A mobile phone may be provided with a plurality of functional modules, which need to cooperate with one another to operate normally. However, when the mobile phone is hit in use, relative positions of the plurality of functional modules may be changed easily, and thus the plurality of functional modules fail to operative cooperatively.

SUMMARY

Embodiments of the present disclosure provide a bracket structure, an input/output assembly and an electronic device.

The bracket structure according to embodiments of the present disclosure includes a first bracket. The first bracket includes a first face, a second face, and a third face. The first face and the second face are arranged on two opposite sides of the first bracket. The third face is connected to the first face and the second face. The second face is provided with at least two accommodating chambers. The first face is provided with at least two through holes corresponding to the at least two accommodating chambers. The third face is provided with a mounting hole passing through the first face and the second face. The mounting hole is arranged between two of the at least two accommodating chambers. The first bracket further includes a fourth face opposite to the third face and connected to the first face and the second face, the at least two accommodating chambers comprise a first chamber, a second chamber, a third chamber and a fourth chamber arranged in sequence, the mounting hole is arranged between the first chamber and the third chamber, the second chamber is arranged between the mounting hole and the fourth face, and the fourth chamber is arranged at a side of the third chamber away from the first chamber.

The input/output assembly according to embodiments of the present disclosure includes at least two first input/output modules and a bracket structure. The bracket structure includes a first bracket. The at least two first input/output modules are mounted on the first bracket. The first bracket includes a first face, a second face and a third face. The first face and the second face are disposed on two opposite sides of the first bracket. The third face is connected to the first face and the second face. The second face defines at least two accommodating chambers therein. The first face is provided with at least two through holes corresponding to the at least two accommodating chambers. The third face defines a mounting hole therein, and the mounting hole passing through the first face and the second face. The mounting hole is disposed between two of the at least two accommodating chambers, and the at least two first input/output modules are disposed in the at least two accommodating chambers and exposed from the first face. An opening size of the through hole is smaller than that of the corresponding accommodating chamber to provide a stop ring, and the accommodating chamber is defined by the stop ring and an inner wall extending around the stop ring.

The electronic device according to embodiments of the present disclosure includes a housing, a bracket structure and at least two input/output modules. The bracket structure is movably mounted in the housing. The at least two input/output modules are arranged on the bracket structure and configured to be exposed out of the housing or hidden by the housing when the bracket structure moves in the housing. The bracket structure includes a first face, a second face and a third face. The first face and the second face are disposed on two opposite sides of the bracket structure. The third face is connected to the first face and the second face. The second face defines at least two accommodating chambers therein. The first face is provided with at least two through holes corresponding to the at least two accommodating chambers. The third face defines a mounting hole therein, and the mounting hole passing through the first face and the second face. The mounting hole is disposed between two of the at least two accommodating chambers, and the at least two input/output modules are disposed in the at least two accommodating chambers and exposed from the first face. The first bracket further includes a fourth face opposite to the third face and connected to the first face and the second face, the first bracket comprises a mounting portion between the mounting hole and the fourth face, and the first bracket further comprises a positioning column protruding from a side of the mounting portion where the first face is.

Additional aspects and advantages of the embodiments of the present disclosure will be partially given in the following description, some of which will become apparent from the following description or be learned from practices of the present disclosure.

BRIEF DESCRIPTION OF THE DRAWINGS

The foregoing and/or additional aspects and advantages of the present disclosure become obvious and easily understood in descriptions of the embodiments with reference to the following accompanying drawings.

DETAILED DESCRIPTION

Figure 1:
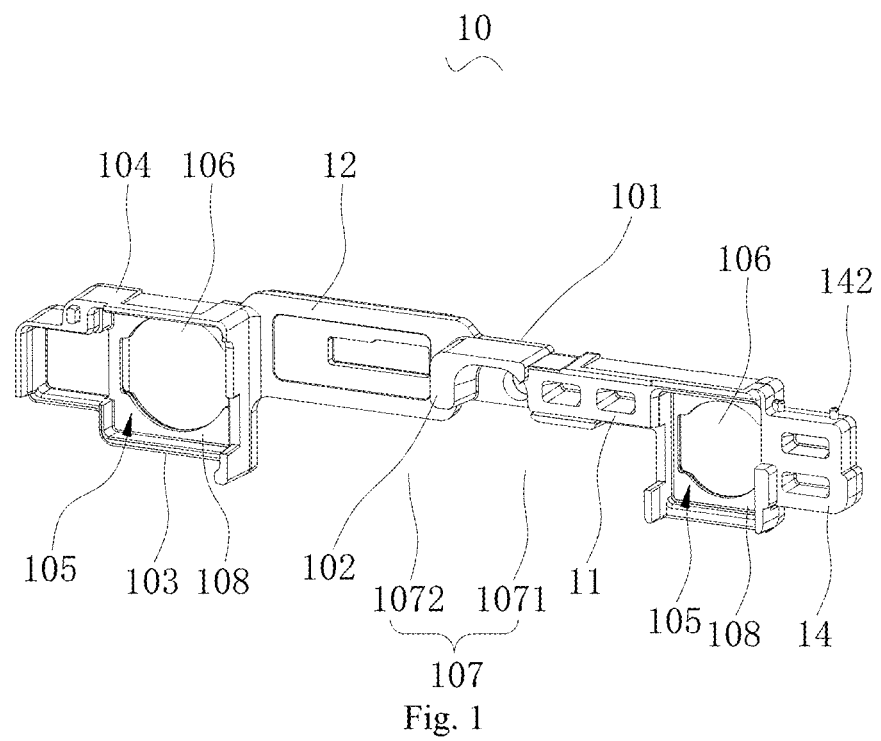
FIGS. 1 to 5 are perspective views of a bracket structure according to some embodiments of the present disclosure.

Embodiments of the present disclosure will be further described with reference to the drawings. The same or similar elements and the elements having the same or similar functions are denoted by like reference numerals throughout the descriptions.

In addition, embodiments described herein with reference to the drawings are explanatory, serve to explain the present disclosure, and are not construed to limit embodiments of the present disclosure.

In the present disclosure, unless specified or limited otherwise, the first characteristic is "on" or "under" the second characteristic refers to the first characteristic and the second characteristic can be direct or via media indirect mountings, connections, and couplings. And, the first characteristic is "on", "above", "over" the second characteristic may refer to the first characteristic is right over the second characteristic or is diagonal above the second characteristic, or just refer to the horizontal height of the first characteristic is higher than the horizontal height of the second characteristic. The first characteristic is "below" or "under" the second characteristic may refer to the first characteristic is right over the second characteristic or is diagonal under the second characteristic, or just refer to the horizontal height of the first characteristic is lower than the horizontal height of the second characteristic.

Embodiments of the present disclosure provide a bracket structure, including a first bracket configured to hold at least two first input/output modules.

In some embodiments, the first input/output module at least includes an infrared light source, an infrared camera and a first visible light camera; the bracket structure further includes a second bracket coupled to the first bracket and configured for an arrangement of a second input/output module, and the second input/output module at least includes a second visible light camera.

In some embodiments, the first bracket and the second bracket are integrally formed as a single member; or the first bracket and the second bracket are separate members.

In some embodiments, the first bracket includes a first face, a second face and a third face, the first face and the second face are arranged on two opposite sides of the first bracket, the third face is connected to the first face and the second face, the second face is provided with at least two accommodating chambers, the first face is provided with at least two through holes corresponding to the at least two accommodating chambers, the third face is provided with a mounting hole passing through the first face and the second face, the mounting hole is arranged between two of the at least two accommodating chambers, and the first input/output module is mounted in the at least two accommodating chambers and exposed from the first face; the second bracket is mounted in the mounting hole and is provided with a receiving chamber, and the second input/output module is mounted in the receiving chamber.

In some embodiments, the first bracket includes a first face, a second face and a third face, the first face and the second face are arranged on two opposite sides of the first bracket, the third face is connected to the first face and the second face, the second face is provided with at least two accommodating chambers, the first face is provided with at least two through holes corresponding to the at least two accommodating chambers, the third face is provided with a mounting hole passing through the first face and the second face, the mounting hole is arranged between two of the at least two accommodating chambers, the first input/output module is mounted in the at least two accommodating chambers and exposed from the first face, and the mounting hole is configured to expose the first input/output module.

In some embodiments, an opening size of the through hole is smaller than that of the corresponding accommodating chamber to provide a stop ring, and the accommodating chamber is defined by the stop ring and an inner wall extending around the stop ring.

In some embodiments, the first bracket further includes a fourth face opposite to the third face and connected to the first face and the second face, the first bracket includes a mounting portion between the mounting hole and the fourth face, and the first bracket further includes a positioning column protruding from a side of the mounting portion where the first face is.

In some embodiments, the mounting portion is provided with an accommodating groove passing through the first face and the second face.

In some embodiments, the first bracket further includes a fourth face opposite to the third face and connected to the first face and the second face, the first bracket includes a fixing portion between the mounting hole and the fourth face, the fixing portion is provided with the accommodating chamber in a side of the fixing portion where the second face is, the accommodating chamber is provided with the through hole corresponding to the accommodating chamber in a side of the accommodating chamber where the first face is, and an opening size of the through hole is smaller than that of the accommodating chamber.

In some embodiments, the opening size of the through hole is smaller than that of the accommodating chamber to provide a stop ring, and the accommodating chamber is defined by the stop ring and an inner wall extending around the stop ring; or the bracket structure further includes a holding part, the accommodating chamber passes through the third face and the fourth face, and the holding part is mounted in the accommodating chamber to cover an opening in a side of the accommodating chamber where the third face is.

In some embodiments, the first bracket has an extension portion, and the first bracket further includes an engaging column protruding from a side of the extension portion where the first face is.

In some embodiments, the first bracket further includes a fourth face opposite to the third face and connected to the first face and the second face, and the first bracket further includes a clamping column protruding from a side of the extension portion where the fourth face is.

In some embodiments, the first bracket further includes a fourth face opposite to the third face and connected to the first face and the second face, the at least two accommodating chambers comprise a first chamber, a second chamber, a third chamber and a fourth chamber arranged in sequence, the mounting hole is arranged between the first chamber and the third chamber, the second chamber is arranged between the mounting hole and the fourth face, and the fourth chamber is arranged at a side of the third chamber away from the first chamber.

In some embodiments, the first bracket further includes a fourth face opposite to the third face and connected to the first face and the second face, the at least two accommodating chambers comprise a first chamber, a second chamber, a third chamber and a fourth chamber arranged in sequence, the mounting hole is arranged between the first chamber and the third chamber, the second chamber is arranged between the mounting hole and the fourth face, the fourth chamber is arranged at a side of the third chamber away from the first chamber; the second bracket includes a side wall and a separator, the side wall of the second bracket is coupled to the first bracket, the side wall of the second bracket encloses a receiving chamber, and the separator is disposed in the receiving chamber and separates the receiving chamber into a first sub-receiving chamber and a second sub-receiving chamber.

In some embodiments, a connection line between a center of the first sub-receiving chamber and a center of the second sub-receiving chamber is parallel to a connection line between a center of the first chamber and a center of the third chamber.

In some embodiments, a face of the separator on the same side as the second face is provided with a receiving hole.

In some embodiments, the bracket structure further includes a rear housing and a front housing, the front housing is mounted to the rear housing, and the first bracket is mounted between the rear housing and the front housing.

Embodiments of the present disclose provide an input/output assembly, including: a bracket structure comprising a first bracket; and at least two first input/output modules mounted on the first bracket.

In some embodiments, the first input/output module at least includes an infrared light source, an infrared camera and a first visible light camera; the input/output assembly further includes a second input/output module, and the second input/output module at least includes a second visible light camera; the bracket structure further includes a second bracket, the second bracket is coupled to the first bracket, and the second input/output module is mounted on the second bracket.

In some embodiments, the first bracket and the second bracket are integrally formed as a single member; or the first bracket and the second bracket are separate members.

In some embodiments, the first bracket includes a first face, a second face and a third face, the first face and the second face are arranged on two opposite sides of the first bracket, the third face is connected to the first face and the second face, the second face is provided with at least two accommodating chambers, the first face is provided with at least two through holes corresponding to the at least two accommodating chambers, the third face is provided with a mounting hole passing through the first face and the second face, the mounting hole is arranged between two of the at least two accommodating chambers, and the first input/output module is mounted in the at least two accommodating chambers and exposed from the first face; the second bracket is mounted in the mounting hole and is provided with a receiving chamber, and the second input/output module is mounted in the receiving chamber.

In some embodiments, the first bracket includes a first face, a second face and a third face, the first face and the second face are arranged on two opposite sides of the first bracket, the third face is connected to the first face and the second face, the second face is provided with at least two accommodating chambers, the first face is provided with at least two through holes corresponding to the at least two accommodating chambers, the third face is provided with a mounting hole passing through the first face and the second face, the mounting hole is arranged between two of the at least two accommodating chambers, the first input/output module is mounted in the at least two accommodating chambers and exposed from the first face, and the mounting hole is configured to expose the first input/output module.

In some embodiments, an opening size of the through hole is smaller than that of the corresponding accommodating chamber to provide a stop ring, and the accommodating chamber is defined by the stop ring and an inner wall extending around the stop ring.

In some embodiments, the first input/output module includes a proximity sensor, the proximity sensor includes a proximity-sensor circuit board and a proximity-sensor body, the first bracket further includes a fourth face opposite to the third face and connected to the first face and the second face, the first bracket includes a mounting portion between the mounting hole and the fourth face, the first bracket further includes a positioning column protruding from a side of the mounting portion where the first face is, the proximity-sensor circuit board is disposed on the first face at the mounting portion and engaged with the positioning column, and the proximity-sensor body is disposed on a side of the proximity-sensor circuit board opposite to the first face.

In some embodiments, the mounting portion is provided with an accommodating groove passing through the first face and the second face, and the proximity-sensor circuit board passes through the accommodating groove and extends to a side where the second face is.

In some embodiments, the first input/output module includes a receiver, the receiver includes a receiver body and a receiver circuit board, the first bracket further includes a fourth face opposite to the third face and connected to the first face and the second face, the first bracket includes a fixing portion between the mounting hole and the fourth face, the accommodating chamber is defined in a side of the fixing portion where the second face is, the through hole corresponding to the accommodating chamber is defined in a side of the accommodating chamber where the first face is, an opening size of the through hole is smaller than that of the accommodating chamber, and the receiver body is accommodated in the accommodating chamber and carried on the receiver circuit board.

In some embodiments, the opening size of the through hole is smaller than that of the accommodating chamber to provide a stop ring, and the accommodating chamber is defined by the stop ring and an inner wall extending around the stop ring; or the bracket structure further includes a holding part, the accommodating chamber passes through the third face and the fourth face, and the holding part is mounted in the accommodating chamber and configured to hold the receiver body.

In some embodiments, the first input/output module includes a fill light, the fill light includes a fill-light body and a fill-light circuit board, the first bracket has an extension portion, the first bracket further includes an engaging column protruding from a side of the extension portion where the first face is, the fill-light circuit board is disposed on the first face at the extension portion and engaged with the engaging column, and the fill-light body is disposed on a side of the fill-light circuit board opposite to the first face.

In some embodiments, the first input/output module includes a light sensor, the light sensor includes a light-sensor body and a light-sensor circuit board, the first bracket further includes a fourth face opposite to the third face and connected to the first face and the second face, the first bracket further includes a clamping column protruding from a side of the extension portion where the fourth face is, the fill-light circuit board is disposed on the fourth face at the extension portion and engaged with the clamping column, and the light-sensor body is disposed on a side of the light-sensor circuit board opposite to the fourth face.

In some embodiments, the input/output assembly further includes a light guiding module, the light guiding module being disposed above the light-sensor body to guide lights to the light sensor.

In some embodiments, the first input/output module further includes a receiver, the first bracket further includes a fourth face opposite to the third face and connected to the first face and the second face, the at least two accommodating chambers comprise a first chamber, a second chamber, a third chamber and a fourth chamber arranged in sequence, the mounting hole is arranged between the first chamber and the third chamber, the second chamber is arranged between the mounting hole and the fourth face, the fourth chamber is arranged on a side of the third chamber away from the first chamber, the first visible light camera is mounted in the third chamber, the receiver is mounted in the second chamber, the infrared camera is mounted in the first chamber, the infrared light source is mounted in the fourth chamber, and the second input/output module is mounted in the mounting hole.

In some embodiments, the first input/output module includes an infrared camera, a first visible light camera, a receiver and an infrared light source, the first bracket further includes a fourth face opposite to the third face and connected to the first face and the second face, the at least two accommodating chambers comprise a first chamber, a second chamber, a third chamber and a fourth chamber arranged in sequence, the mounting hole is arranged between the first chamber and the third chamber, the second chamber is arranged between the mounting hole and the fourth face, the fourth chamber is arranged on a side of the third chamber away from the first chamber, the first visible light camera is mounted in the third chamber, the receiver is mounted in the second chamber, the infrared camera is mounted in the first chamber, the infrared light source is mounted in the fourth chamber, and the mounting hole is configured to expose a second visible light camera.

In some embodiments, a light incident direction of the first visible light camera is opposite to a light incident direction of the second visible light camera.

In some embodiments, the mounting hole is further configured to expose a third visible light camera, and the second visible light camera forms a dual-camera module together with the third visible light camera.

In some embodiments, the first visible light camera is a front-facing camera and the dual-camera module is a back-facing camera module; or the first visible light camera is a back-facing camera and the dual-camera module is a front-facing camera module.

In some embodiments, the infrared light source and the infrared camera form a structured-light depth camera; or the infrared light source and the infrared camera form a time-of-flight depth camera.

In some embodiments, the input/output assembly further includes a mainboard electrically coupled to the infrared camera, the first visible light camera, the receiver and the infrared light source.

In some embodiments, the bracket structure further includes a rear housing and a front housing, the front housing is mounted to the rear housing, the first bracket is mounted between the rear housing and the front housing, the front housing is provided with a front-housing light transmission hole corresponding to the first input/output module, the rear housing is provided with a rear-housing light transmission hole corresponding to the first input/output module, and the front-housing light transmission hole or the rear-housing light transmission hole allows lights outside the first input/output assembly to be transmitted to the first input/output module, or lights sent out by the first input/output module to be transmitted to outside of the input/output assembly.

In some embodiments, the second bracket includes a side wall and a separator, the side wall of the second bracket is coupled to the first bracket, the side wall of the second bracket encloses a receiving chamber, the separator is disposed in the receiving chamber and separates the receiving chamber into a first sub-receiving chamber and a second sub-receiving chamber, the second input/output module further includes a third visible light camera, and the second visible light camera and the third visible light camera are mounted in the first sub-receiving chamber and the second sub-receiving chamber, respectively.

In some embodiments, a connection line between a center of the first sub-receiving chamber and a center of the second sub-receiving chamber is parallel to a connection line between a center of the first chamber and a center of the third chamber.

In some embodiments, a face of the separator on the same side as the second face is provided with a receiving hole, and the second input/output module further includes a floodlight mounted in the receiving hole.

In some embodiments, the bracket structure further includes a rear housing and a front housing, the front housing is mounted to the rear housing, the first bracket, the second bracket, the first input/output module and the second input/output module are mounted between the rear housing and the front housing, the front housing is provided with a front-housing light transmission hole corresponding to the first input/output module, the rear housing is provided with a rear-housing light transmission hole corresponding to the second input/output module, the front-housing light transmission hole or the rear-housing light transmission hole allows lights outside the input/output assembly to be transmitted to the first input/output module or the second input/output module, or allows lights sent out by the first input/output module or the second input/output module to be transmitted to outside of the input/output assembly.

Embodiments of the present disclosure provide an electronic device, including: a housing; a bracket structure being movably mounted in the housing; and at least two input/output modules arranged on the bracket structure, and configured to be exposed out of the housing or hidden by the housing when the bracket structure moves in the housing.

Figure 13:
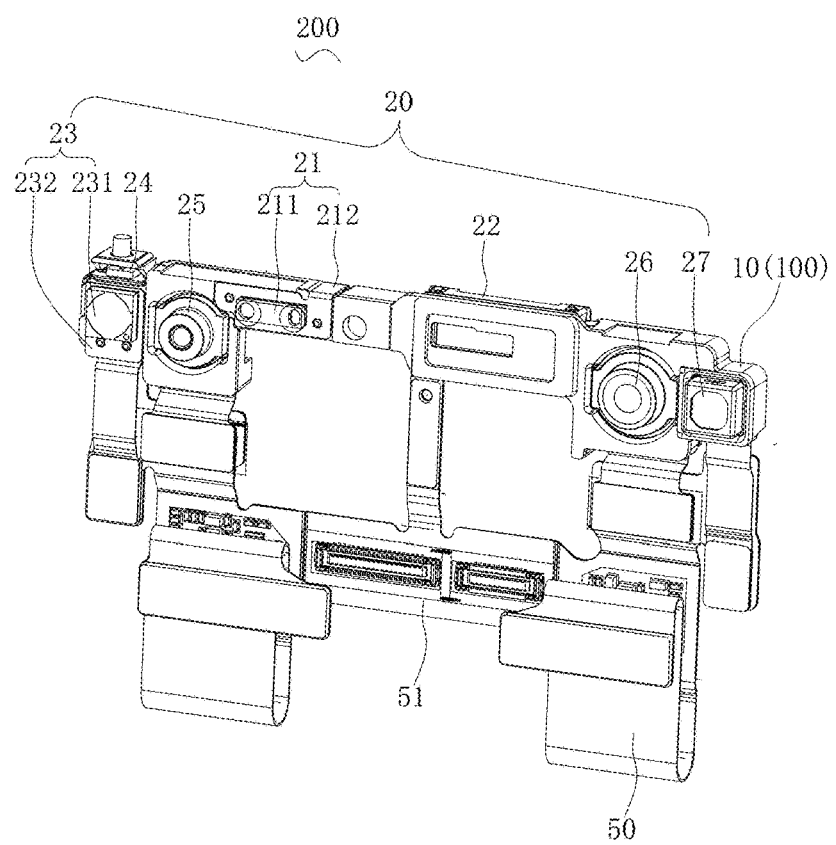
Figure 15:
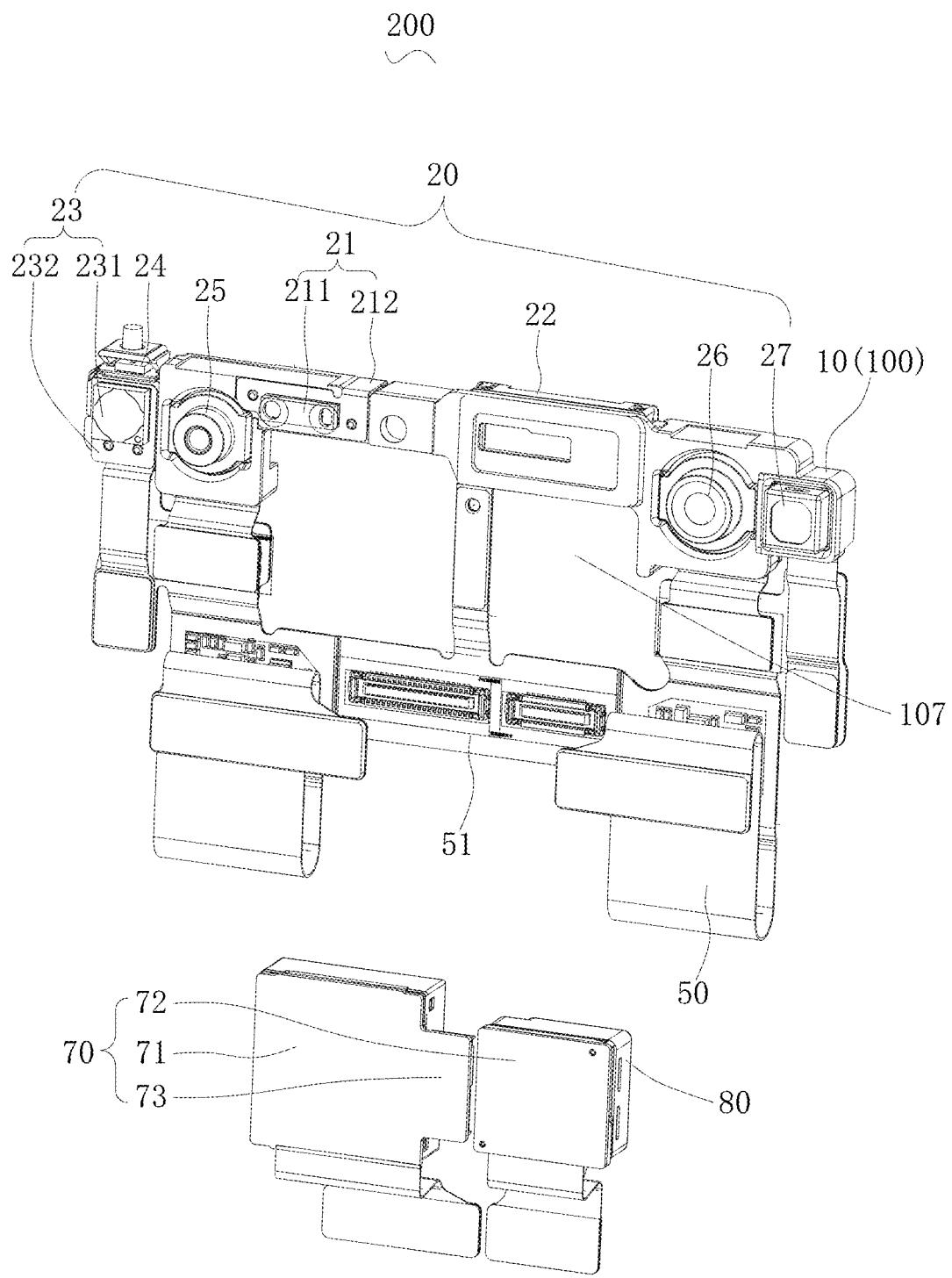

As illustrated in FIGS. 1 to 5, a bracket structure 100 according to embodiments of the present disclosure includes a first bracket 10. The first bracket 10 is configured for an arrangement of a first input/output module 20 (as illustrated in FIG. 13 and FIG. 15), and at least two first input/output modules 20 are provided.

Figure 4:
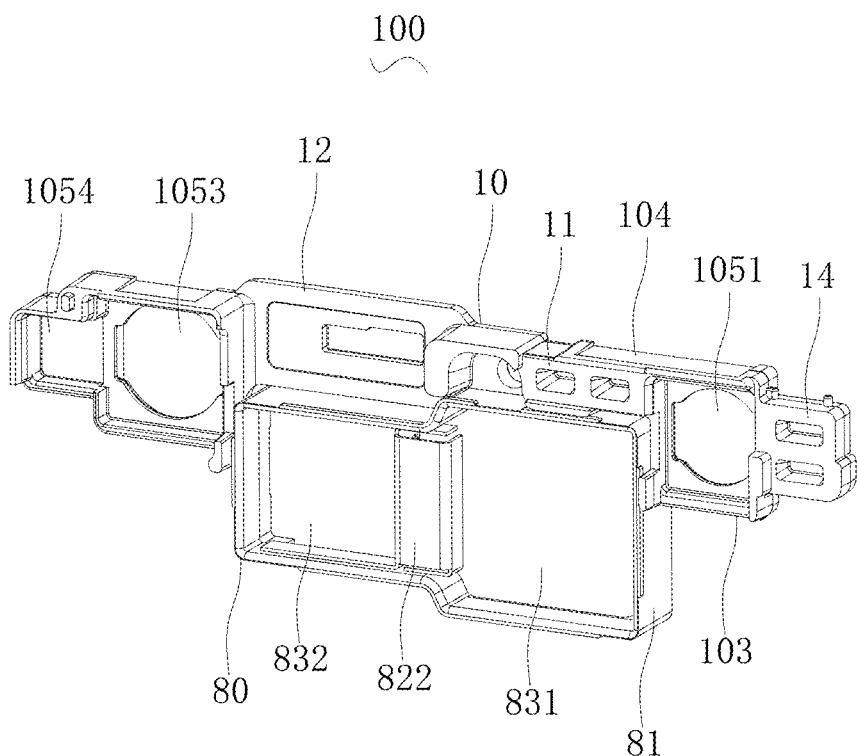
Figure 5:
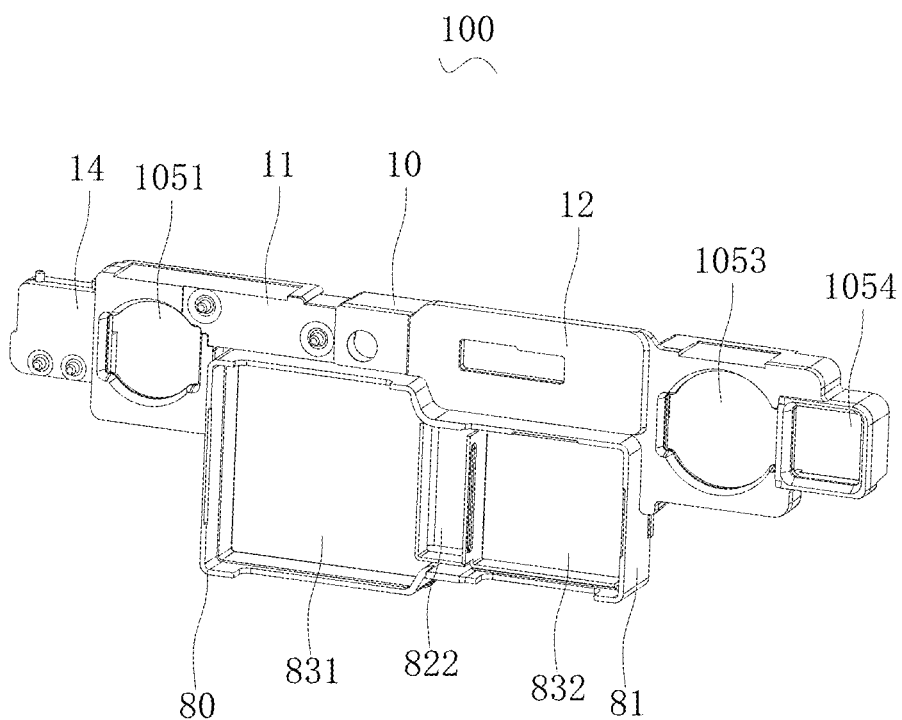
Figure 6:
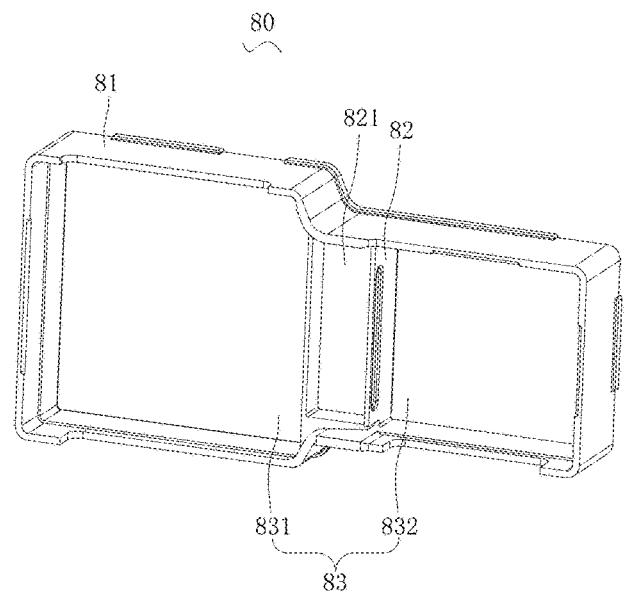
FIG. 6 is a perspective view of a second bracket of a bracket structure according to some embodiments of the present disclosure.

As illustrated in FIGS. 4 to 6, the bracket structure 100 according to embodiments of the present disclosure includes a first bracket 10 and a second bracket 80. The first bracket 10 is configured for the arrangement of the first input/output module 20 (as illustrated in FIG. 13 and FIG. 15). The first input/output module 20 at least includes an infrared light source 27, an infrared camera 25 and a first visible light camera 26. The second bracket 80 is coupled to the first bracket 10 and is configured for an arrangement of a second input/output module 70 (refer to FIG. 17). The second input/output module 70 at least includes a second visible light camera 71.

The first bracket 10 and the second bracket 80 may be separate members. In some embodiments, both the first bracket 10 and the second bracket 80 may be integrally formed into a single member. The first bracket 10 and the second bracket 80 may be coupled by one or more of the following methods: welding, adhesive bonding, threaded connection and engagement. Or, the first bracket 10 and the second bracket 80 may be integrally formed into a single member.

The first bracket 10 may be provided with an accommodating chamber 105 (refer to FIG. 1), and the first input/output module 20 is mounted on the first bracket 10; the second bracket 80 may be provided with a receiving chamber 83, and the second input/output module 70 is mounted on the second bracket 80.

The infrared light source 27 and the infrared camera 25 form a structured-light depth camera; or the infrared light source 27 and the infrared camera 25 form a time-of-flight (TOF) depth camera. In the present embodiment, the light incident direction of the first visible light camera 26 may be opposite to the light incident direction of the second visible light camera 71.

For the bracket structure 100 according to embodiments of the present disclosure, when the first input/output module 20 is mounted on the first bracket 10, relative positions of the infrared light source 27, the infrared camera 25 and the first visible light camera 26 mounted on the first bracket 10 may not be changed easily, thus the infrared light source 27, the infrared camera 25 and the first visible light camera 26 may operate cooperatively. Further, the second bracket 80 is coupled to the first bracket 10 to provide the bracket structure 100, and thus the second input/output module 70 mounted on the second bracket 80 and the first input/output module 20 mounted on the first bracket 10 can be fixed together. Therefore, it is convenient for different manufacturers to mount the first input/output module 20 on the first bracket 10 and to mount the second input/output module 70 on the second bracket 80.

As illustrated in FIG. 1 and FIG. 4, the bracket structure 100 according to embodiments of the present disclosure includes a first bracket 10 and a second bracket 80. The first bracket 10 includes a first face 101, a second face 102 and a third face 103. The first face 101 and the second face 102 are arranged on two opposite sides of the first bracket 10. The third face 103 is connected to the first face 101 and the second face 102. The second face 102 is provided with at least two accommodating chambers 105. The first face 101 is provided with at least two through holes 106 corresponding to the at least two accommodating chambers 105. The third face 103 is provided with a mounting hole 107 passing through the first face 101 and the second face 102. The mounting hole 107 is arranged between two accommodating chambers 105. The first input/output module 20 is mounted in at least two accommodating chambers 105 (refer to FIG. 15) and exposed from the first face 101. The second bracket 80 is mounted in the mounting hole 107 and coupled to the first bracket 10. The second bracket 70 is provided with a receiving chamber 83. The second input/output module 70 is mounted in the receiving chamber 83.

There may be two, three, four, five, six, seven or any number of accommodating chambers 105 in the first bracket 10. The number of the through hole 106 is the same with the number of the accommodating chamber 105, and each through hole 106 communicates with one corresponding accommodating chamber 105. Each first input/output module 20 is mounted in one accommodating chamber 105. The first input/output module 20 mounted in the accommodating chamber 105 may be exposed from the first face 101 through the through hole 106. In embodiments of the present disclosure, "be exposed from" indicates that the first input/output module 20 can be observed from the first face 101. For example, the first input/output module 20 may be exposed out of the first bracket 10 from the first face 101 through the through hole 106 of the first face 101. Or, the first input/output module 20 may not pass through the through hole 106, but it is visible from the through hole 106.

As illustrated in FIG. 6, there may be one, two, three, four or any number of receiving chambers 83. There may be one, two, three, four or any number of the second input/output modules 70 mounted in the receiving chambers 83. The number of the second input/output module 70 may be greater than, less than or equal to the number of the receiving chamber 83.

The mounting hole 107 is arranged in the middle of the first bracket 10 along a longitudinal direction of the first bracket 10 and between two accommodating chambers 105. When the second input/output module 70 is mounted on the second bracket 80, the second input/output module 70 may be exposed from the second bracket 80 and the first face 101 of the first bracket 10.

In the bracket structure 100 according to embodiments of the present disclosure, since the mounting hole 107 is arranged between the two accommodating chambers 105, the second input/output module 70 mounted in the mounting hole 107 can be prevented from being blocked by the first bracket 10, thus facilitating the arrangement of the second input/output module 70 on the bracket structure 100, and providing a compact structure for the bracket structure 100.

Figure 2:
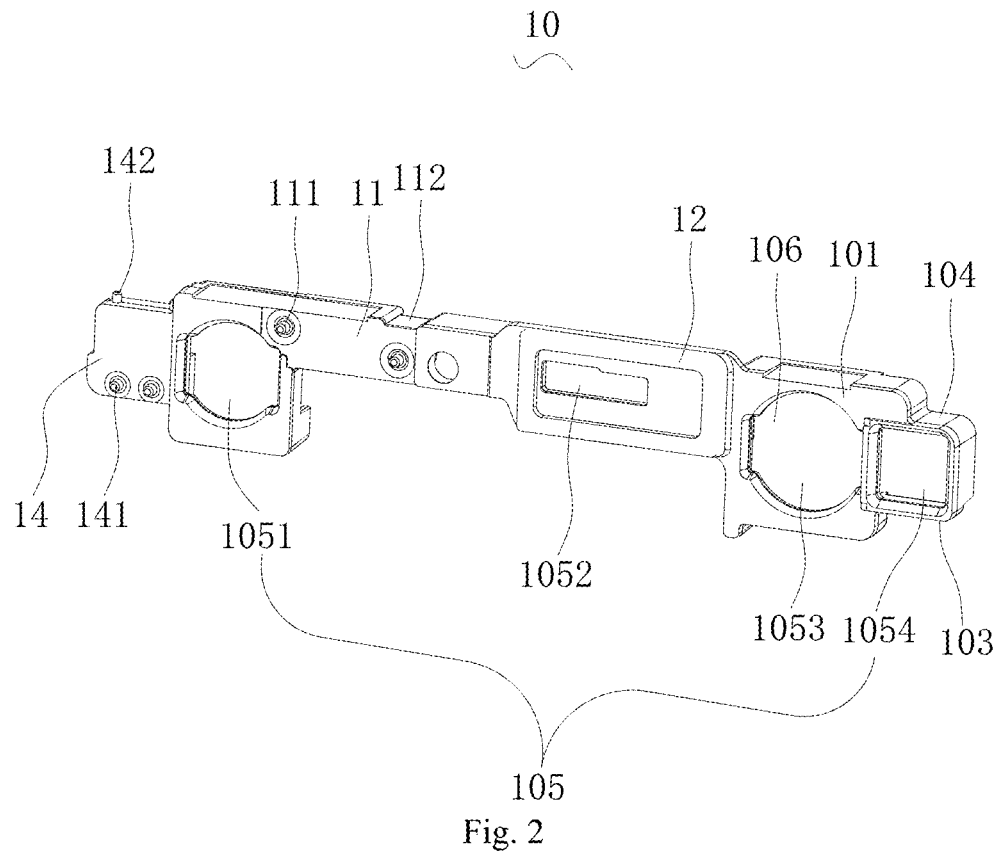
Figure 3:
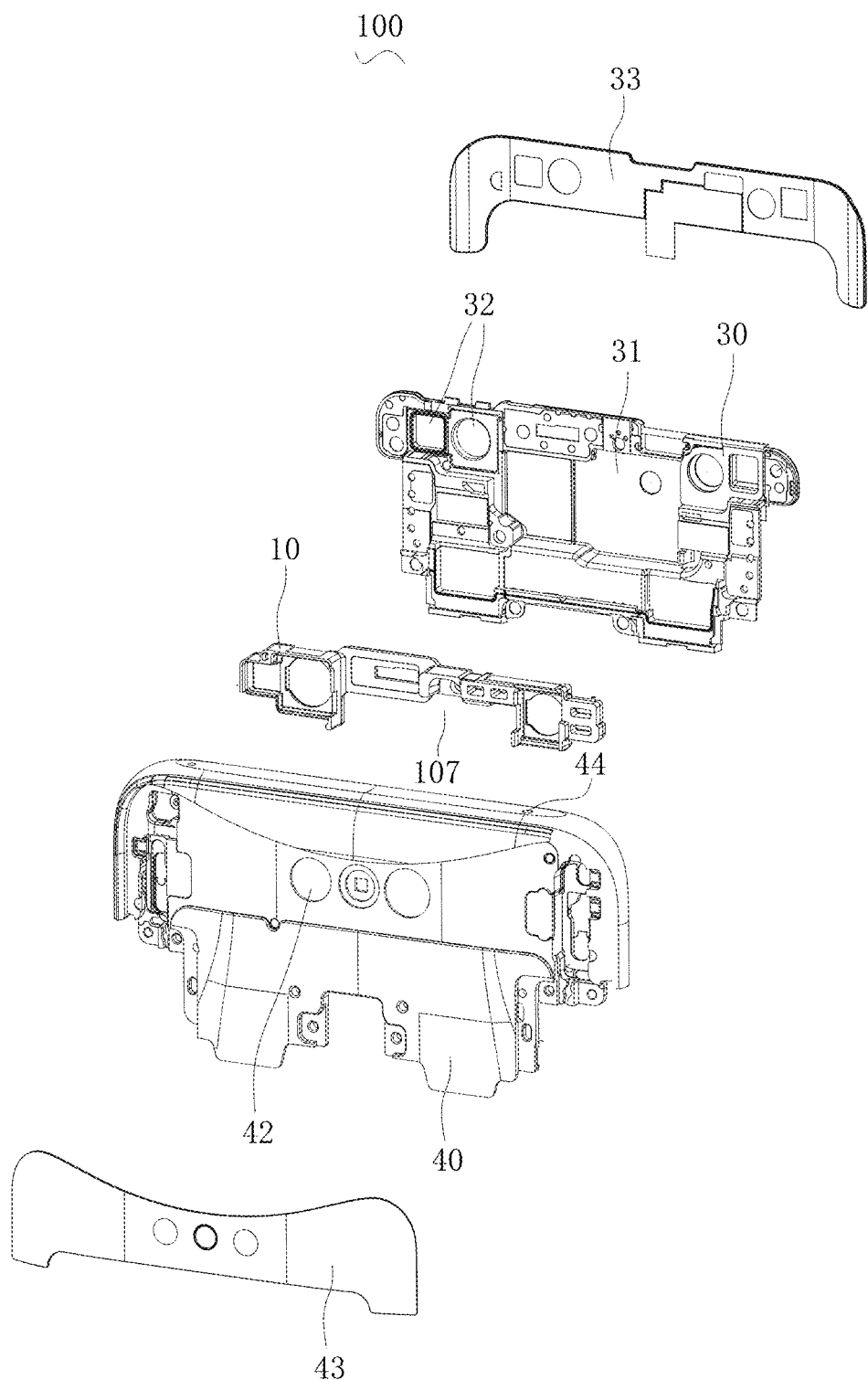

As illustrated in FIGS. 1 to 3, the bracket structure 100 according to embodiments of the present disclosure includes a first bracket 10. The first bracket 10 includes a first face 101, a second face 102 and a third face 103. The first face 101 and the second face 102 are arranged on two opposite sides of the first bracket 10. The third face 103 is connected to the first face 101 and the second face 102. The second face 102 is provided with at least two accommodating chambers 105. The first face 101 is provided with at least two through holes 106 corresponding to the at least two accommodating chambers 105. The third face 103 is provided with a mounting hole 107 passing through the first face 101 and the second face 102. The mounting hole 107 is arranged between the two accommodating chambers 105. The first input/output module 20 is mounted in the at least two accommodating chambers 105 and exposed from the first face 101, and the mounting hole 107 is configured to expose the first input/output module 20.

The first bracket 10 is an integrally formed member. There may be two, three, four, five, six, seven or any number of the accommodating chambers 105 on the first bracket 10. The number of the through hole 106 is the same with the number of the accommodating chamber 105 and each through hole 106 communicates with one corresponding accommodating chamber 105. Each first input/output module 20 is mounted in one accommodating chamber 105. The first input/output module 20 mounted in the accommodating chamber 105 can be exposed from the first face 101 through the through hole 106. In embodiments of the present disclosure, "be exposed from" indicates that the first input/output module 20 can be observed from the first face 101. For example, the first input/output module 20 may be exposed out of the first bracket 10 from the first face 101 through the through hole 106 of the first face 101. Or, the first input/output module 20 may not pass through the through hole 106, but it is visible from the through hole 106.

The mounting hole 107 is arranged in the middle of the first bracket 10 along a longitudinal direction of the first bracket 10 and between two accommodating chambers 105. The first input/output module 20 may be mounted in mounting hole 107 and exposed from the first face 101. Or, there is no direct mounting connection between the first input/output module 20 and the mounting hole 107, and the mounting hole 107 provided in the first bracket 10 is simply configured to prevent the first bracket 10 from blocking the first input/output module 20 arranged at the mounting hole 107.

In the bracket structure 100 according to embodiments of the present disclosure, as positions of the at least two accommodating chambers 105 in the first bracket 10 will not change, relative positions of a plurality of first input/output modules 20 will not be changed easily when the plurality of first input/output modules 20 are mounted in the accommodating chambers 105, thereby facilitating the plurality of first input/output modules 20 to operate cooperatively. Furthermore, by providing the mounting hole 107 between the two accommodating chambers 105, the first input/output module 20 mounted at the mounting hole 107 can be prevented from being blocked by the first bracket 10, thus facilitating the arrangement of the first input/output module 20 on the bracket structure 100, and providing a more compact structure for the bracket structure 100.

As illustrated in FIGS. 1 to 3, the bracket structure 100 according to embodiments of the present disclosure includes a first bracket 10, a front housing 30 and a rear housing 40.

The first bracket 10 includes a first face 101, a second face 102, a third face 103 and a fourth face 104. The first face 101 and the second face 102 are arranged on two opposite sides of the first bracket 10. The third face 103 and the fourth face 104 are arranged on two opposite sides of the first bracket 10 and both connected to the first face 101 and the second face 102.

The second face 102 is provided with four accommodating chambers 105, namely, a first chamber 1051, a second chamber 1052, a third chamber 1053 and a fourth chamber 1054. The first chamber 1051, the second chamber 1052, the third chamber 1053 and the fourth chamber 1054 are in sequence arranged along a longitudinal direction of the first bracket 10. The fourth chamber 1054 is arranged in an end of the first bracket 10. Centers of the first chamber 1051, the third chamber 1053 and the fourth chamber 1054 are on the same straight line. The first face 101 is provided with four through holes 106 corresponding to the four accommodating chambers 105, and each through hole 106 communicates with one corresponding accommodating chamber 105. An opening size of the through hole 106 is smaller than that of the corresponding accommodating chamber 105 to provide a stop ring 108, and the accommodating chamber 105 is defined by the stop ring 108 and an inner wall extending around the stop ring 108.

The third face 103 is provided with a mounting hole 107 passing through the first face 101 and the second face 102. The mounting hole 107 is arranged between the first chamber 1051 and the third chamber 1053. The mounting hole 107 includes a first sub-mounting hole 1071 adjacent to the first chamber 1051 and a second sub-mounting hole 1072 adjacent to the third chamber 1053. In addition, the third chamber 1052 is arranged between the second sub-mounting hole 1072 and the fourth face 104. The first sub-mounting hole 1071 communicates with the second sub-mounting hole 1072 and a size of the first sub-mounting hole 1071 is greater than a size of the second sub-mounting hole 1072. In other embodiments, the size of the first sub-mounting hole 1071 may be smaller than or equal to that of the second sub-mounting hole 1072.

The first bracket 10 includes a mounting portion 11, a fixing portion 12, an extension portion 14, a positioning column 111, an engaging column 141 and a clamping column 142.

The mounting portion 11 is arranged between the mounting hole 107 (the first sub-mounting portion 1071) and the fourth face 104, and also between the first chamber 1051 and the second chamber 1052. A recess may be formed in a side of the mounting portion 11 where the first face 101 is, such that the first input/output module 20 can be positioned and mounted to the mounting portion 11 conveniently. The fourth face 104 at the mounting portion 11 is provided with an accommodating groove 112 passing through the first face 101 and the second face 102. The positioning column 111 protrudes from a side the mounting portion 11 where the first face 101 is. There may be one, two, three or any number of positioning columns 111. In other embodiments, the side of the mounting portion 11 where the first face 101 is includes a protruding stage; or, the first face 101 at the mounting portion 11 is flush with the first face 101 corresponding to an outer wall of the first chamber 1051.

The fixing portion 12 is arranged between the mounting hole 107 (the second sub-mounting portion 1072) and the fourth face 104 and also between the mounting portion 11 and the third chamber 1053. The fixing portion 12 is connected to a side wall of the mounting portion 11 away from the first chamber 1051. The second chamber 1052 is provided in the fixing portion 12. In some embodiments, the second chamber 1052 is provided in a side of the fixing portion 12 where the second face 102 is.

The extension portion 14 is arranged at a side of the first chamber 1051 away from the third chamber 1053. In some embodiments, the extension portion 14 is arranged at an end of the first bracket 10 opposite to the fourth chamber 1054. A recess may be formed in a side of the extension portion 14 where the first face 101 is, such that the first input/output module 20 can be positioned and mounted to the extension portion 14 conveniently. The engaging column 141 protrudes from the side of the extension portion 14 where the first face 101 is. There may be one, two, three or any number of engaging columns 141. The clamping column 142 protrudes from a side of the extension portion 14 where the fourth face 104 is. There may be one, two, three or any number of clamping columns 142. In other embodiments, the side of the extension portion 14 where the first face 101 is includes a protruding stage; or, the first face 101 at the extension portion 14 is flush with the first face 101 corresponding to an outer wall of the first chamber 1051.

The front housing 30 defines a front-housing chamber 31 and a front-housing light transmission hole 32 passing through the front housing 30 and communicating with the front-housing chamber 31.

Figure 7:
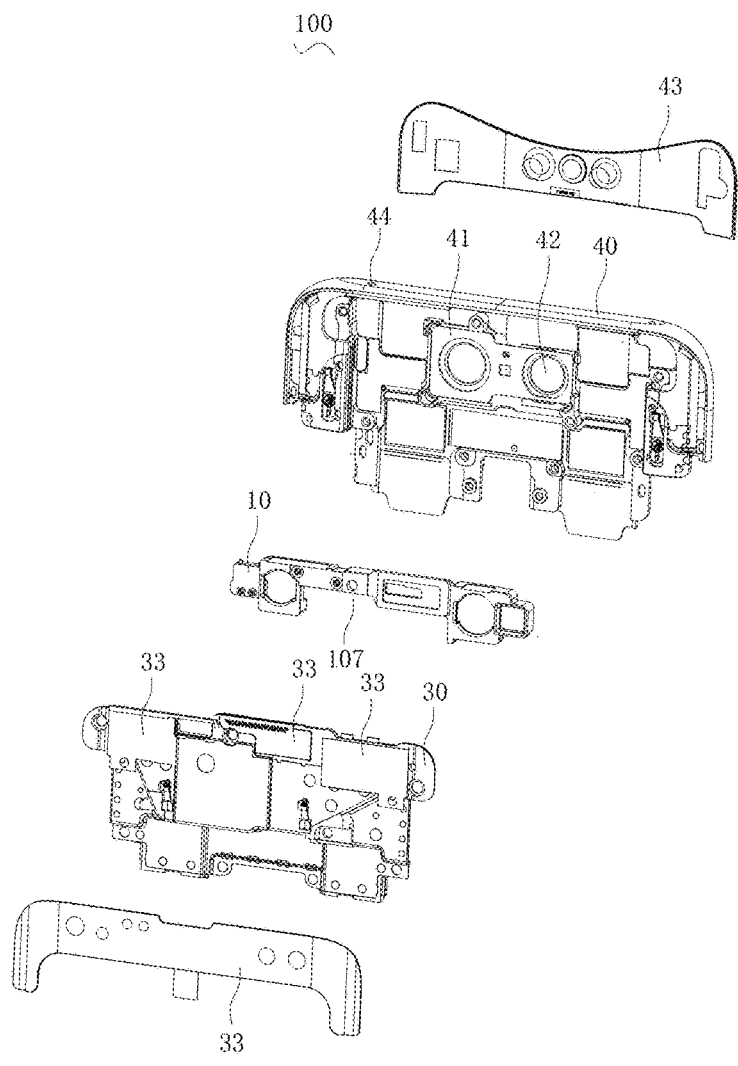
FIGS. 7 to 10 are perspective views of a bracket structure according to some embodiments of the present disclosure.

As illustrated in FIG. 7, the rear housing 40 defines a rear-housing chamber 41 and a rear-housing light transmission hole 42 passing through the rear housing 40 and communicating with the rear-housing chamber 41. The front housing 30 is fixed to the rear housing 40 such that the front-housing chamber 31 and the rear-housing chamber 41 form an accommodating cavity (not illustrated) together. The first bracket 10 and the first input/output module 20 are accommodated in the accommodating cavity. A face of the rear housing 40 corresponding to the fourth face 104 is also provided with a light guiding hole 44 communicating with the accommodating cavity.

In other embodiments, a side of the front housing 30 opposite to the front-housing chamber 31 is provided with a light-transmission front-housing protective cover 33, which may be a glass cover. A side of the rear housing 40 opposite to the rear-housing chamber 41 is provided with a light-transmission rear-housing protective cover 43, which may be a glass cover. The front-housing protective cover 33 and the rear-housing protective cover 43 may further be used to seal the accommodating cavity.

In the bracket structure 100 according to embodiments of the present disclosure, as positions of the at least two accommodating chambers 105 in the first bracket 10 will not change, relative positions of a plurality of first input/output modules 20 will not be changed easily when the plurality of first input/output modules 20 are mounted in the accommodating chambers 105, thereby facilitating the plurality of first input/output modules 20 to operate cooperatively. Furthermore, the bracket structure 100 provides the mounting hole 107 between the two accommodating chambers 105, which prevents the first input/output module 20 mounted at the mounting hole 107 from being blocked by the first bracket 10 and facilitates the arrangement of the first input/output module 20 on the bracket structure 100, thereby providing a more compact structure for the bracket structure 100.

The bracket structure 100 according to embodiments of the present disclosure further has the following significant effects. First, the first bracket 10 includes the stop ring 108, and thus the first input/output module 20 can be conveniently mounted on the first bracket 10 under a position limiting effect of the stop ring 108. Second, the mounting portion 11 is provided with the positioning column 111 and the accommodating groove 112, thereby facilitating the first input/output module 20 (a proximity-sensor circuit board 212) to be mounted on the mounting portion 11. Third, the first bracket 10 includes the mounting portion 11 and the fixing portion 12 configured for the arrangement of the first input/output module 20 between the fourth face 104 and the mounting hole 107, which provides the bracket structure 100 with a more compact structure. The engaging column 141 and the clamping column 142 are disposed on the extension portion 14, and thus it is convenient for the first input/output module 20 to be mounted on the extension portion 14. Centers of the first chamber 1051, the third chamber 1053 and the fourth chamber 1054 are on the same straight line, such that the first input/output modules 20 mounted in the first chamber 1051, the third chamber 1053 and the fourth chamber 1054 may work cooperatively. The bracket structure 100 includes the front housing 30 and the rear housing 40, such that it is convenient to fix the first bracket 10 and the first input/output module 20.

As illustrated in FIG. 1, FIG. 4 and FIG. 6, in some embodiments, the bracket structure 100 further includes a second bracket 80. The second bracket 80 includes a side wall 81 and a separator 82. The side wall 81 is coupled to the first bracket 10. In some embodiments, the side wall 81 may be coupled to a side wall surrounding the mounting hole 107 by at least one of following methods: adhesive bonding, engagement, welding and threaded connection. The side wall 81 encloses a receiving chamber 83. The separator 82 is disposed in the receiving chamber 83 and separates the receiving chamber 83 into a first sub-receiving chamber 831 and a second sub-receiving chamber 832. A connection line between a center of the first sub-receiving chamber 831 and a center of the second sub-receiving chamber 832 is parallel to a connection line between the center of the first chamber 1051 and the center of the third chamber 1053. A size of the first sub-receiving chamber 831 is greater than a size of the second sub-receiving chamber 832. The first sub-receiving chamber 831 corresponds to the first sub-mounting hole 1071 and the second sub-receiving chamber 832 corresponds to the second sub-mounting hole 1072. Thicknesses at different positions of the side wall 81 may be the same or different.

The separator 82 is provided with a receiving hole 821 passing through faces of the separator 82 corresponding to the first face 101 and the second face 102. In other embodiments, the second bracket 80 may be not provided with the separator 82. In this manner, the first sub-receiving chamber 831 communicates with the second sub-receiving chamber 832. Or, the receiving hole 821 may also be a blind hole provided in a face of the separator 82 that is at the same side as the second face 102.

Figure 8:
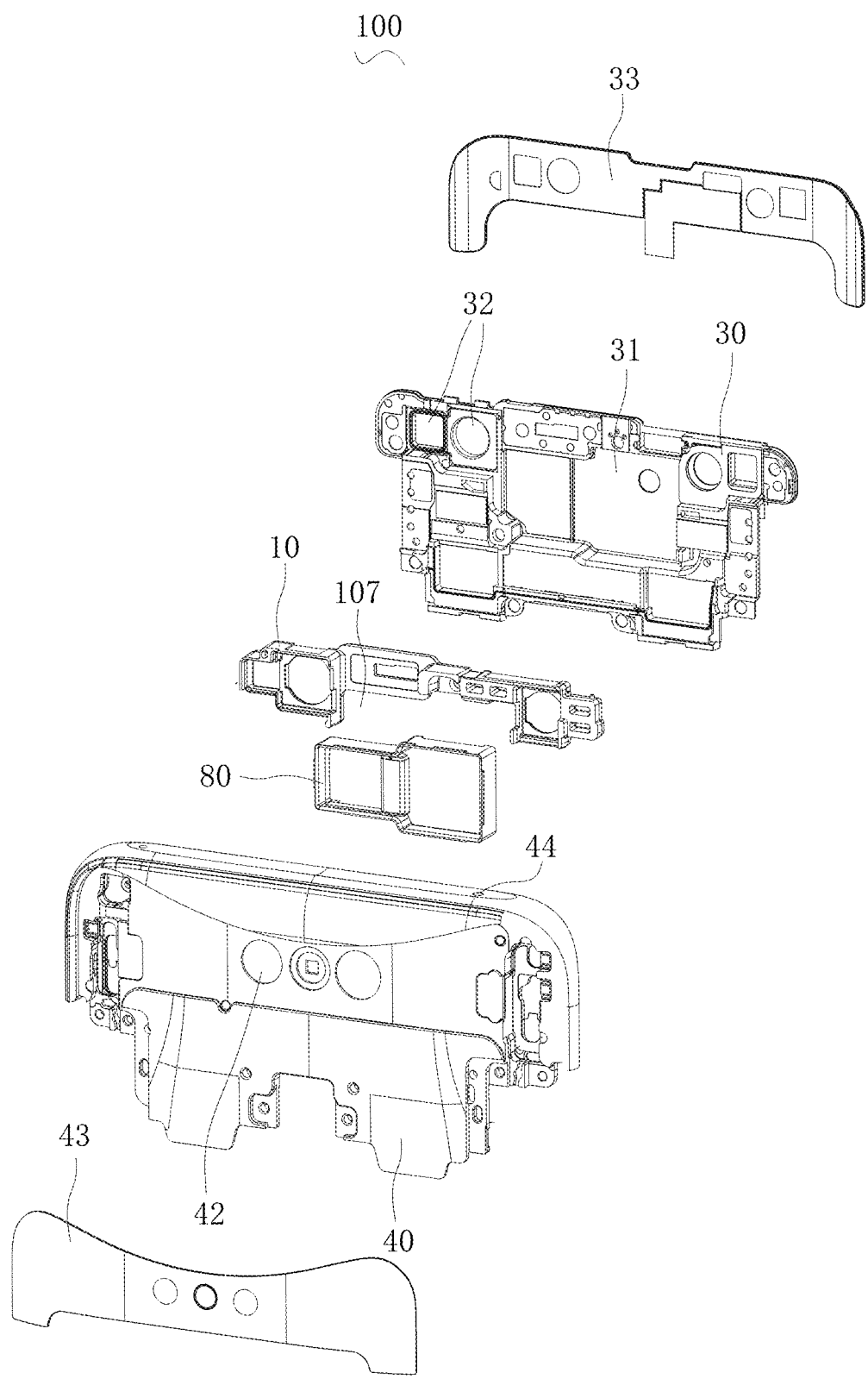
Figure 9:
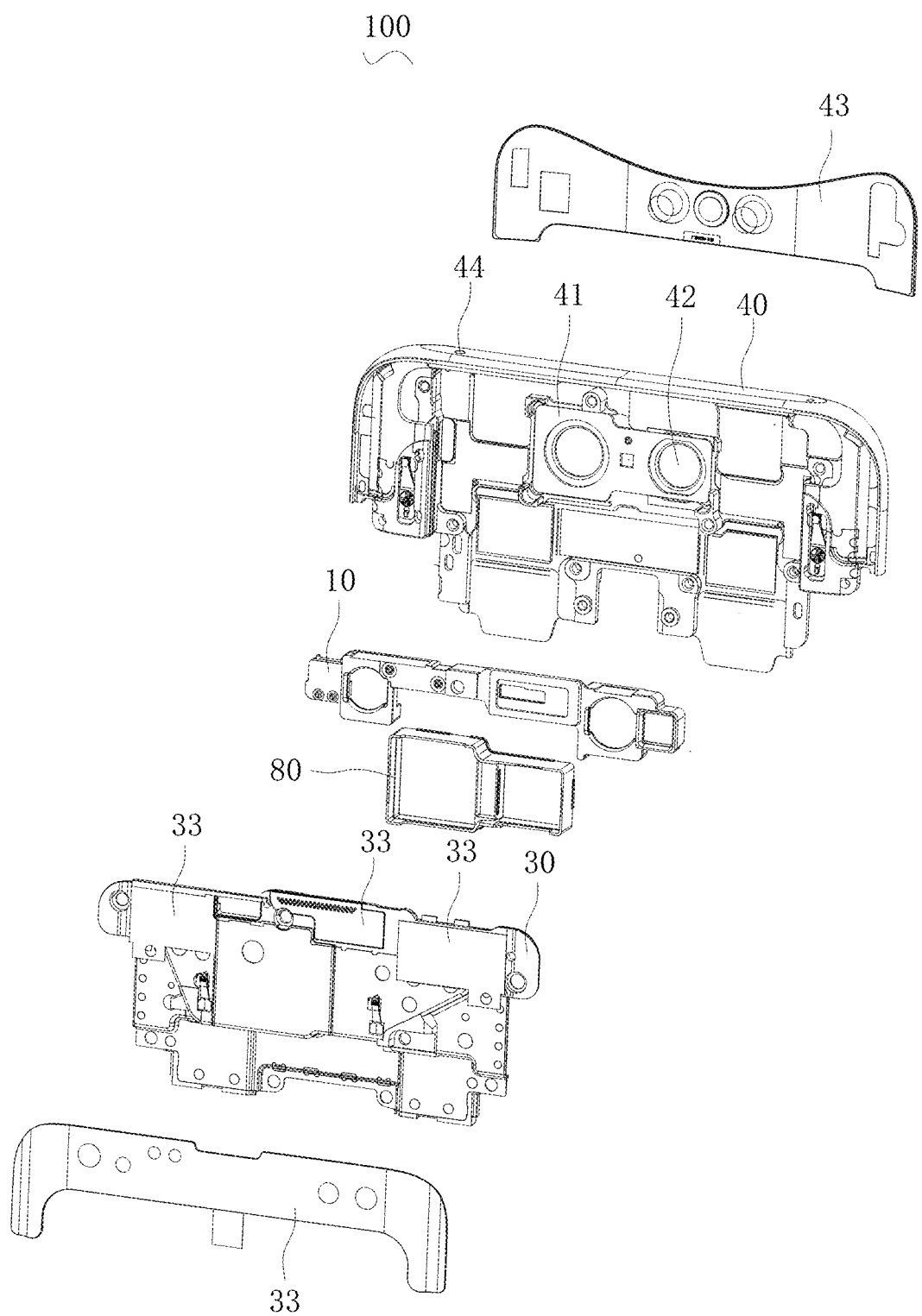

As illustrated in FIG. 8 and FIG. 9, the first bracket 10, the second bracket 80, the first input/output module 20 and the second input/output module 70 are all accommodated in the accommodating cavity defined by the front-housing chamber 31 and the rear-housing chamber 41. The first bracket 10 and the second bracket 80 may be mounted on the front housing 30 and the rear housing 40, respectively, such that the first bracket 10 is coupled to the second bracket 80.

In the bracket structure 100 according to embodiments of the present disclosure, as positions of the at least two accommodating chambers 105 on the first bracket 10 will not change, relative positions of a plurality of first input/output modules 20 will not be changed easily when the plurality of first input/output modules 20 are mounted in the accommodating chambers 105, thereby facilitating the plurality of first input/output modules 20 to operate cooperatively. Furthermore, the first bracket 10 provides the mounting hole 107 between the two accommodating chambers 105, which prevents the second input/output module 70 mounted at the mounting hole 107 from being blocked by the first bracket 10 and facilitates the second bracket 80 and the second input/output module 70 to be arranged on the bracket structure 100, thereby providing a compact structure for the bracket structure 100. In addition, the size of the first sub-mounting hole 1071 differs from that of the second sub-mounting hole 1072, thus facilitating the second bracket 80 to be mounted in the mounting hole 107. The connection line between the center of the first sub-receiving chamber 831 and the center of the second sub-receiving chamber 832 is parallel to the connection line between the center of the first chamber 1051 and the center of the third chamber 1053, thereby providing the bracket structure 100 with an artistic appearance.

Figure 10:
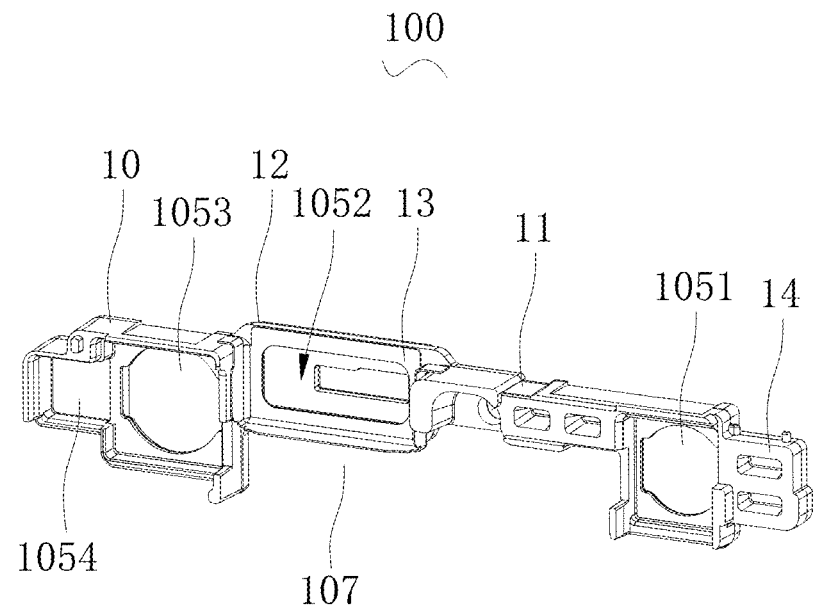
Figure 11:
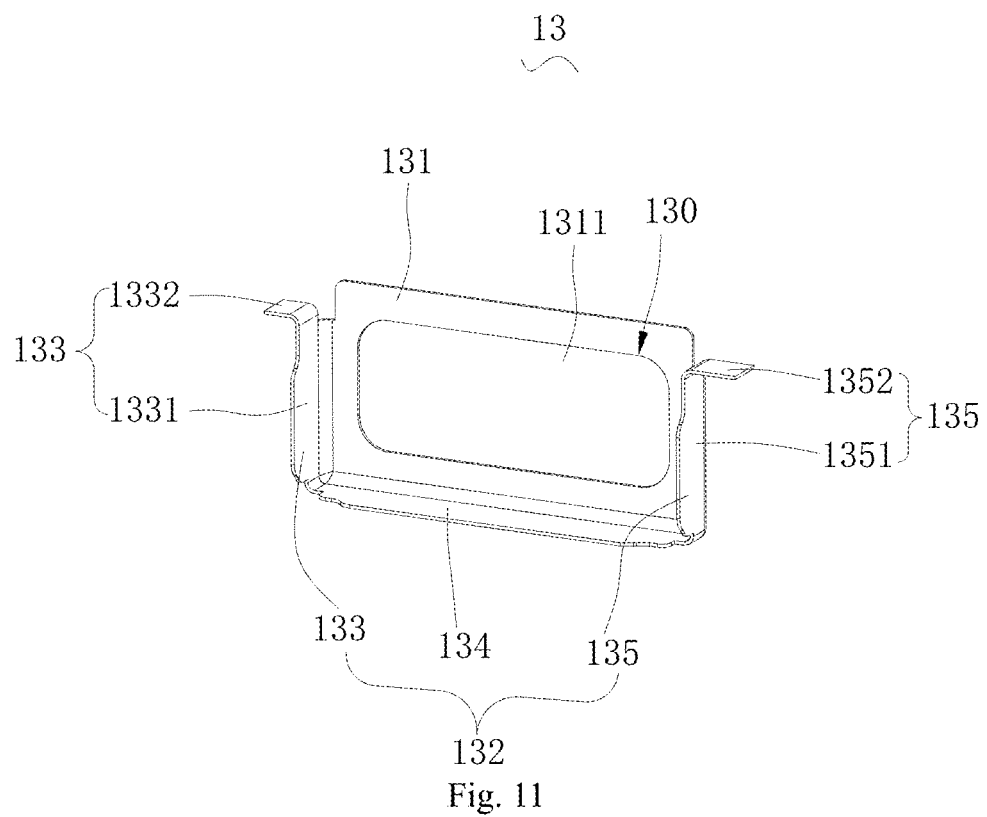
FIG. 11 is a perspective view of a holding part of a bracket structure according to some embodiments of the present disclosure.

As illustrated in FIG. 10 and FIG. 11, in some embodiments, the second chamber 1052 passes through the third face 103 and the fourth face 104 at the fixing portion 12. The bracket structure 100 further includes a holding part 13 fixed in the second chamber 1052. The first input/output module 20 is mounted on the holding part 13.

In some embodiments, the holding part 13 includes a holding bottom plate 131 and holding side walls 132 extending from edges of the holding bottom plate 131. The holding bottom plate 131 and the holding side walls 132 enclose a holding chamber 130 together. A through hole 1311 is provided in the center of the holding bottom plate 131. When the holding part 13 is fixed in the second chamber 1052, the through hole 1311 communicates with the through hole 106 corresponding to the second chamber 1052. The holding side walls 132 include a first holding side wall 133, a second holding side wall 134 and a third holding side wall 135. The first holding side wall 133 is arranged at a side of the holding bottom plate 131 adjacent to the third chamber 1053, the second holding side wall 134 is arranged at a side of the holding bottom plate 131 adjacent to the mounting hole 107 (or the third face 103), and the third holding side wall 135 is arranged at a side of the holding bottom plate 131 adjacent to the mounting portion 11. The second holding side wall 134 may block an opening in a side of the second chamber 1052 where the third face 103 is.

The first holding side wall 133 includes a first side wall body 1331 and a first joining part 1332. The first joining part 1332 extends from an end of the first side wall body 1331 away from the second holding side wall 134 towards a side away from the third holding side wall 135. The third holding side wall 135 includes a third side wall body 1351 and a third joining part 1352. The third joining part 1352 extends from an end of the third side wall body 1351 away from the second holding side wall 134 towards a side away from the first holding side wall 133. When the holding part 13 is mounted in the second chamber 1052, the first joining part 1332 is joined with the fourth face 104 at the third chamber 1053 and the third joining part 1352 is joined with the fourth face 104 at the mounting portion 11, and thus the holding part 13 can be fixed to the fixing portion 12.

The holding part 13 in the present embodiment may be made of materials with high strength. For example, the holding part 13 may be made of steel, aluminum alloys or titanium alloys. In this case, the thickness of the holding side wall 132 of the holding part 13 may be less than that of the corresponding side wall surrounding the accommodating chamber 105, thereby reducing the volume of the bracket structure 100 and increasing the size of the mounting hole 107.

As illustrated in FIG. 11, in other embodiments, the second chamber 1052 may not pass through the fourth face 104. The first holding side wall 133 further includes a first connection part (not illustrated) extending from an end of the first side wall body 1331 away from the holding bottom plate 131 towards a side away from the third holding side wall 135. The third holding side wall 135 further includes a third connection part (not illustrated) extending from an end of the third side wall body 1351 away from the holding bottom plate 131 towards a side away from the first side wall 131. When the holding part 13 is mounted in the second chamber 1052, the first connection part is connected with the side wall of the third chamber 1053 adjacent to the fixing portion 12 and the third connection part is connected with the side wall of the mounting portion 11 adjacent to the fixing portion 12, such that the holding part 13 can be fixed to the fixing portion 12. In this case, the first holding side wall 133 may not be provided with the first joining part 1332 and the third holding side wall 135 may not be provided with the third joining part 1352.

Figure 12:
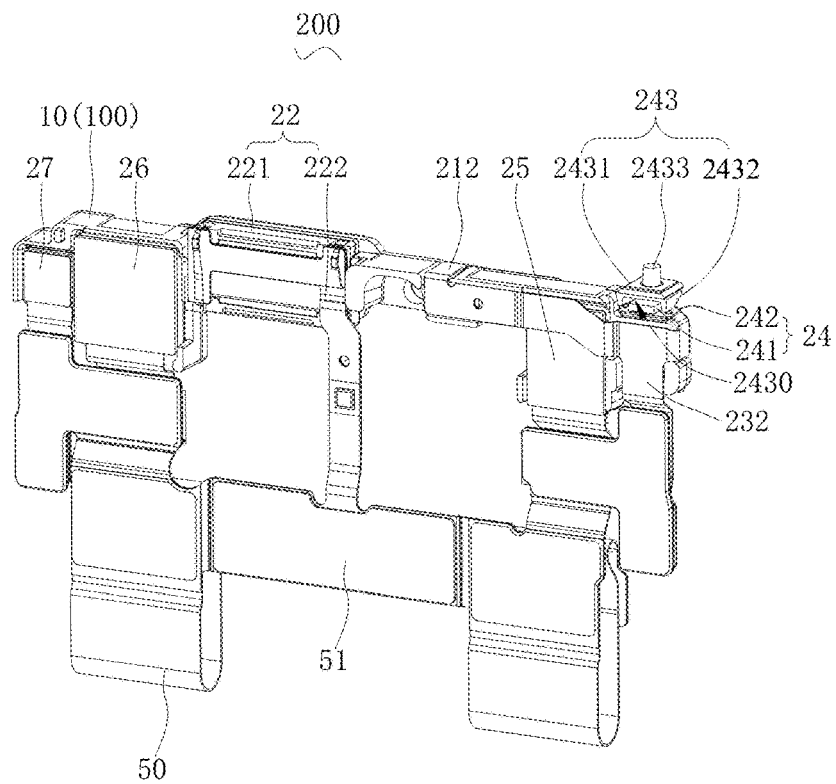
FIGS. 12 to 17 are perspective views of an input/output assembly according to some embodiments of the present disclosure.
Figure 14:
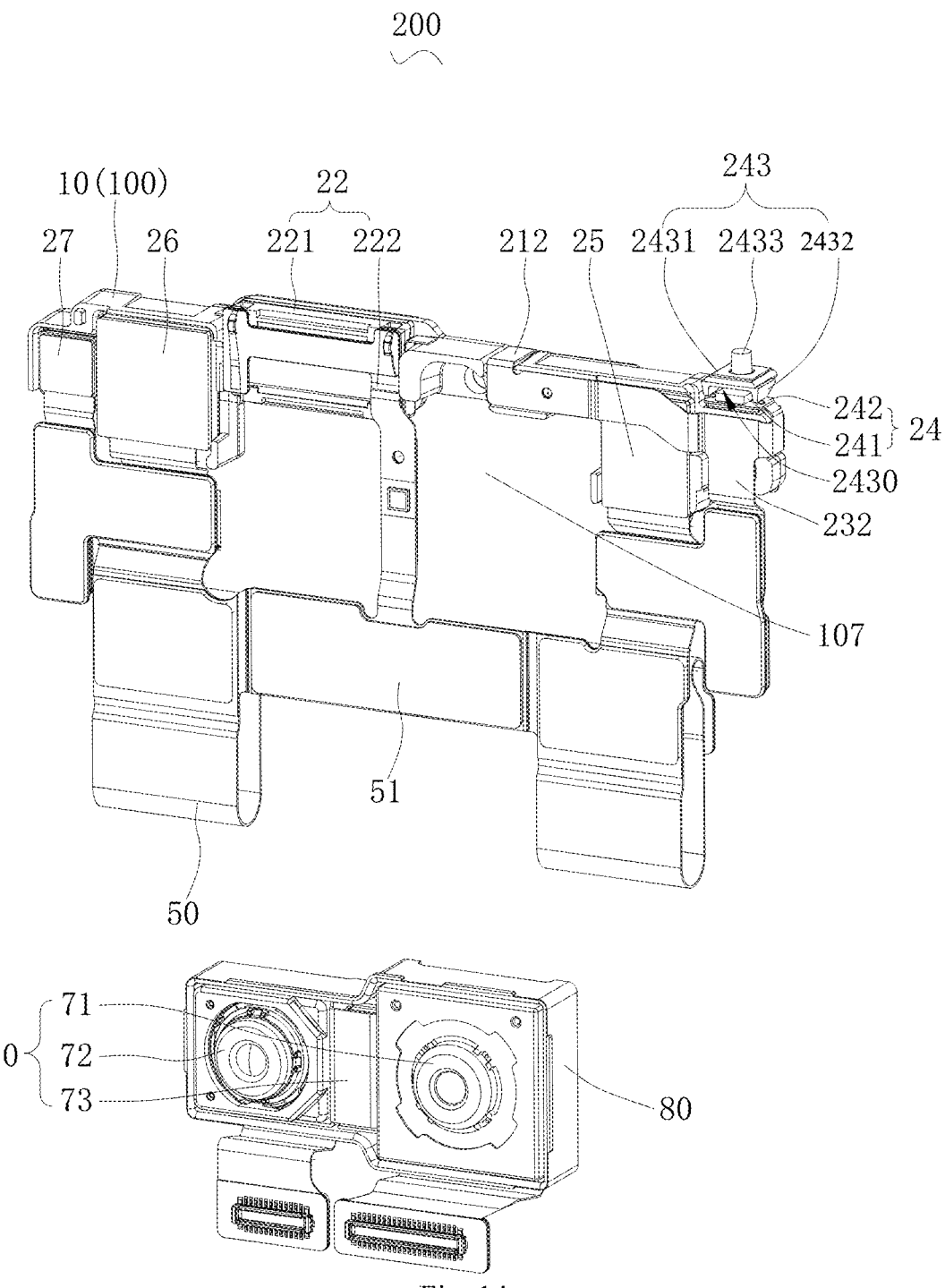

As illustrated in FIG. 12 and FIG. 13, the input/output assembly 200 according to the present disclosure includes a plurality of first input/output modules 20, a bracket structure 100 according to the above embodiments and a mainboard 50. The first input/output modules 20 are mounted on the bracket structure 100. In some embodiments, the first input/output modules 20 are mounted on the first bracket 10. As illustrated in FIG. 14 and FIG. 15, when the input/output assembly 200 further includes a second input/output module 70 and the bracket structure 100 further includes a second bracket 80, the second input/output module 70 is mounted on the second bracket 80.

The first input/output module 20 includes a proximity sensor 21, a receiver 22, a fill light 23, a light sensor 24, an infrared camera 25, a first visible light camera 26 and an infrared light source 2771.

The second input/output module 70 includes a second visible light camera 71.

As illustrated in FIG. 13, the proximity sensor 21 includes a proximity-sensor body 211 and a proximity-sensor circuit board 212. One end of the proximity-sensor circuit board 212 is disposed to the first face 101 at the mounting portion 11 and engaged with the positioning column 111. The other end of the proximity-sensor circuit board 212 passes through the accommodating groove 112 and extends to a side of the mounting portion 11 where the second face 102 lies. The proximity-sensor body 211 is disposed at a side of the proximity-sensor circuit board 212 opposite to the first face 101. In other words, the proximity-sensor body 211 is disposed at a side of the proximity-sensor circuit board 212 away from the first bracket 10. In other embodiments, an adhesive may be arranged between the proximity-sensor circuit board 212 and the first face 101 so as to mount the proximity-sensor circuit board 212 to the mounting portion 11 securely.

As illustrated in FIGS. 12 and 13, the receiver 22 includes a receiver body 221 and a receiver circuit board 222. The receiver body 221 is accommodated in the second chamber 1052. One end of the receiver circuit board 222 is arranged on a side of the receiver body 221 away from the first bracket 10 and the other end of the receiver circuit board 222 extends towards a side where the mounting hole 107 is and passes through the center of the mounting hole 107 (as shown in FIG. 12 or FIG. 14). Or, the other end of the receiver circuit board 222 extends towards a side where the mounting hole 107 is and is arranged at a side of the mounting hole 107 adjacent to the third chamber 1053. In other embodiments, when the holding part 13 is disposed to the fixing portion 12, the receiver body 221 is accommodated in the holding chamber 130.

As illustrated in FIG. 13, the fill light 23 includes a fill-light body 231 and a fill-light circuit board 232. One end of the fill-light circuit board 232 is disposed on the first face 101 at the extension portion 14 and engaged with the engaging column 141, and the other end of the fill-light circuit board 232 extends along a side of the extension portion 14 away from the first chamber 1051 to a side of the extension portion 14 where the second face 102 is. The fill-light body 231 is disposed at a side of the fill-light circuit board 232 opposite to the first face 101. Or, in other words, the fill-light body 231 is disposed at a side of the fill-light circuit board 232 away from the first bracket 10. Furthermore, the proximity-sensor circuit board 212 on the second face 102 extends along a side of the first bracket 10 adjacent to the fourth face 104, passes by the first chamber 1051 and is connected to the fill-light circuit board 232 on the second face 102, thereby preventing the proximity-sensor circuit board 212 from blocking the mounting hole 107. In other embodiments, an adhesive may be disposed between the fill-light circuit board 232 and the first face 101 so as to mount the fill-light circuit board 232 to the extension portion 14 securely.

As illustrated in FIGS. 12 and 13, the light sensor 24 includes a light-sensor body 241 and a light-sensor circuit board 242. One end of the light-sensor circuit board 242 is disposed on the fourth face 104 at the extension portion 14 and engaged with the clamping column 142, and the other end of the light-sensor circuit board 242 is connected to the proximity-sensor circuit board 232 located at the side of the extension portion 14 away from the first chamber 1051 (as shown in FIG. 12 or FIG. 14). Or, the other end of the light-sensor circuit board 242 is connected to the proximity-sensor circuit board 232 located at a side of the extension portion 14 where the second face 102 is. The light-sensor body 241 is disposed at a side of the light-sensor circuit board 242 opposite to the fourth face 104. Or in other words, the light-sensor body 241 is disposed at a side of the light-sensor circuit board 242 away from the first bracket 10. When the first bracket 10 and the light sensor 24 are mounted in the accommodating cavity defined by the front housing 30 and the rear housing 40, the light sensor 24 (the light-sensor body 241) aligns with the light guiding hole 44, and lights outside the accommodating cavity can be transmitted to the light sensor 24 through the light guiding hole 44.

As illustrated in FIGS. 12 and 13, the infrared camera 25 is mounted in the first chamber 1051 and receives lights entered from a side where the first face 101 is.

As illustrated in FIGS. 12 and 13, the infrared light source 27 is mounted in the fourth chamber 1054 and configured to send out infrared lights towards the side where the first face 101 is. The infrared light source 27 and the infrared camera 25 may form a structured-light depth camera. Or, the infrared light source 27 and the infrared camera 25 may form a time-of-flight (TOF) depth camera.

As illustrated in FIG. 2, the first visible light camera 26 is mounted in the third chamber 1053 and configured to receive lights entered from the side where the first face 101 is. In this case, the first visible light camera 26 is a front-facing camera. Or, the first visible light camera 26 may receive lights entered from a side where the second face 102 is. In this case, the first visible light camera 26 is a back-facing camera.

Figure 16:
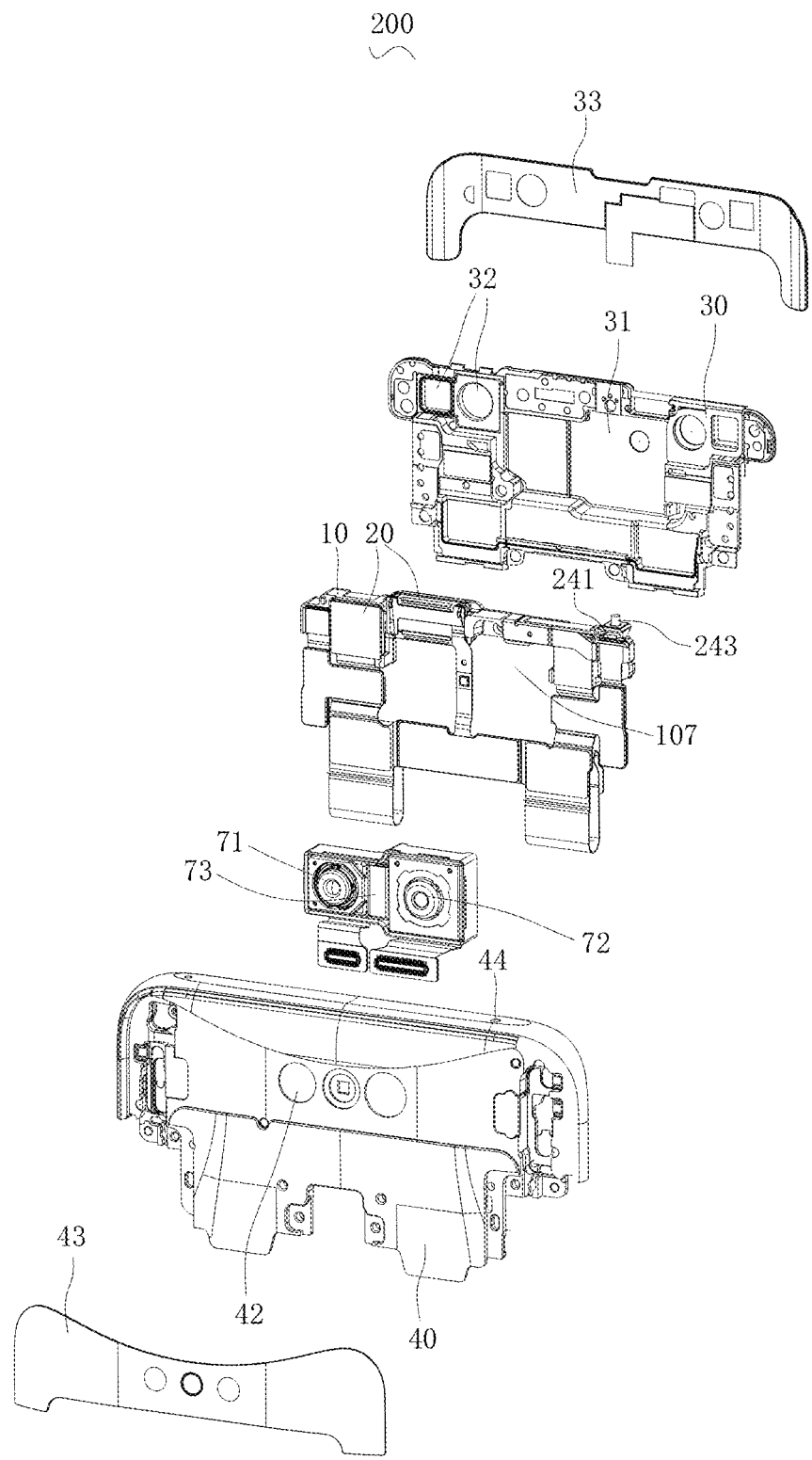
Figure 17:
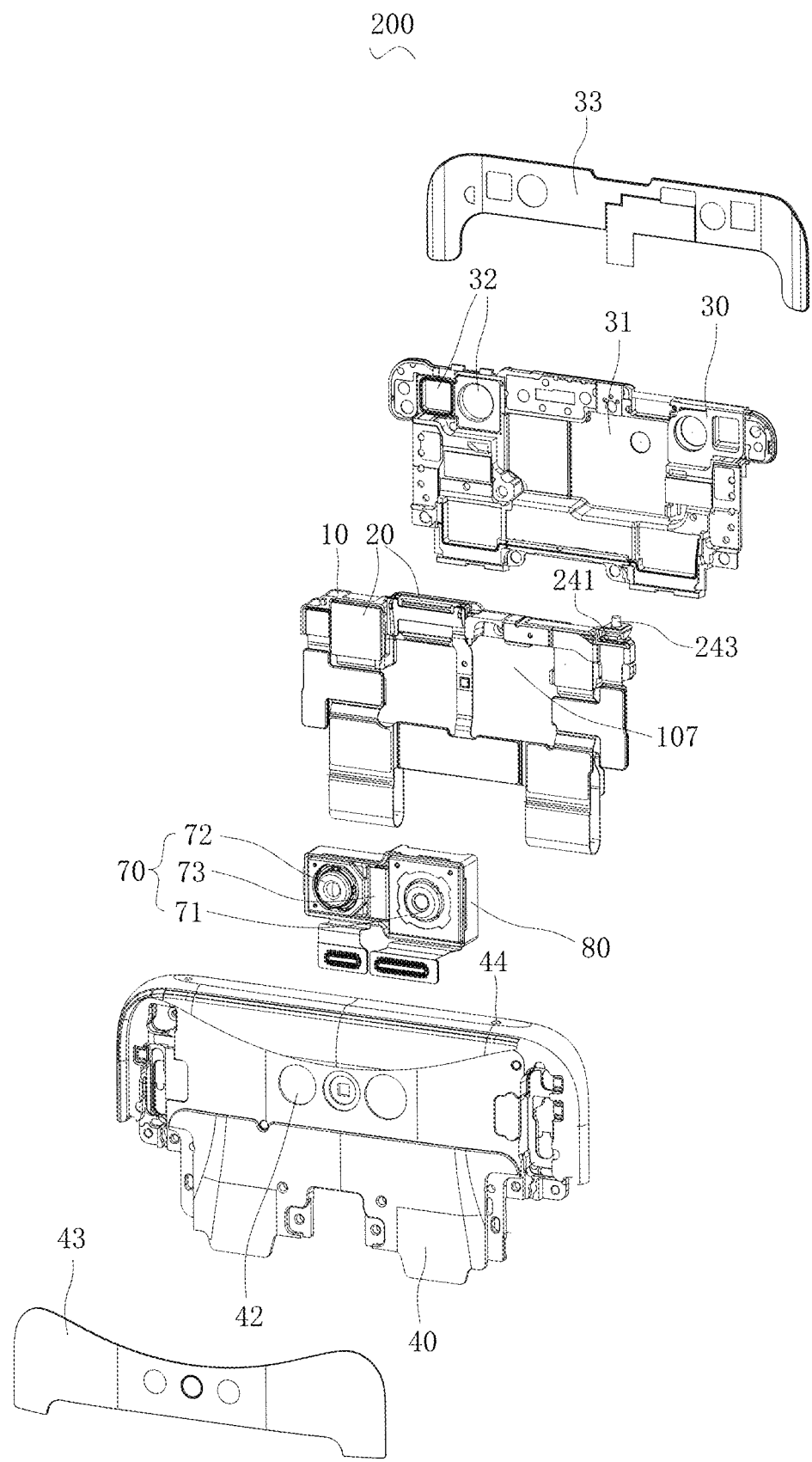

As illustrated in FIG. 16 and FIG. 17, the second visible light camera 71 is disposed at the mounting hole 107 and exposed out of the mounting hole 107. In some embodiments, the second visible light camera 71 is arranged in the receiving chamber 83 (the first sub-receiving chamber 831) and exposed out of the mounting hole 107. The light incident direction of the first visible light camera 26 is opposite to the light incident direction of the second visible light camera 71. When the first visible light camera 26 is the front-facing camera, the second visible light camera 71 is the back-facing camera; and when the first visible light camera 26 is the back-facing camera, the second visible light camera 71 is the front-facing camera.

The mainboard 50 is provided with a plurality of joints 51. The proximity sensor 21, the receiver 22, the fill light 23, the light sensor 24, the infrared camera 25, the first visible light camera 26, the infrared light source 27 and the second visible light camera 71 are all electrically connected to the mainboard 50 through the joints 51.

As illustrated in FIG. 3 and FIGS. 7 to 9, the first bracket 10 and the first input/output module 20 are accommodated in the accommodating cavity defined by the front housing 30 and the rear housing 40. When the first visible light camera 26 is the front-facing camera, a plurality of front-housing light transmission holes 32 are provided, i.e., front-housing light transmission holes 32 corresponding to the extension portion 14, the first chamber 1051, the fixing portion 12, the second chamber 1052 (or the mounting portion 11), the third chamber 1053 and the fourth chamber 1054, respectively. Consequently, lights outside the input/output assembly 200 can enter the infrared camera 25, the proximity sensor 21 and the first visible light camera 26, lights sent out by the fill light 23 and the infrared light source 27 can be projected to the outside of the input/output assembly 200, and sounds generated by the receiver 22 may be transmitted to the outside of the input/output assembly 200. When the second visible light camera 71 is the back-facing camera, the rear-housing light transmission hole 42 corresponds to the second visible light camera 71 so as to allow lights outside the input/output assembly 200 to enter the second visible light camera 71.

When the first input/output module 20 is to be mounted in the accommodating chamber 105, the first input/output module 20 may be mounted into the accommodating chamber 105 along a direction from the second face 102 to the first face 101 until the first input/output module 20 abuts against the stop ring 108, which indicates that the first input/output module 20 is mounted in place and a glue may be dispensed into the accommodating chamber 105. In some embodiments, the glue may be dispensed into a gap between the first input/output module 20 and an inner wall of the accommodating chamber 105. When the glue is cured, the first input/output module 20 is fixedly mounted in the accommodating chamber 105.

In the input/output assembly 200 and the bracket structure 100 according to embodiments of the present disclosure, as positions of the at least two accommodating chambers 105 in the first bracket 10 will not change, relative positions of a plurality of first input/output modules 20 will not be changed easily when the plurality of first input/output modules 20 are mounted in the accommodating chambers 105, thereby facilitating the plurality of first input/output modules 20 to operate cooperatively. Furthermore, the bracket structure 100 provides the mounting hole 107 between the two accommodating chambers 105, which prevents the first input/output module 20 mounted at the mounting hole 107 from being blocked by the first bracket 10 and facilitates the arrangement of the first input/output module 20 on the bracket structure 100, thereby providing a compact structure for the bracket structure 100.

The input/output assembly 200 according to embodiments of the present disclosure further has the following significant effects. Since the centers of the first chamber 1051, the third chamber 1053 and the fourth chamber 1054 are on the same straight line, after the infrared light source 27, the first visible light camera 26 and the infrared camera 25 are mounted in the first chamber 1051, the third chamber 1053 and the fourth chamber 1054, respectively, optical axes of the infrared light source 27, the first visible light camera 26 and the infrared camera 25 are in the same plane, which facilitates the cooperative operation of the infrared light source 27, the first visible light camera 26 and the infrared camera 25.

As illustrated in FIG. 16 and FIG. 17, in other embodiments, the input/output assembly 200 (the second input/output module 70) further includes a third visible light camera 72 disposed in the second sub-receiving chamber 832 and exposed out of the mounting hole 107. A light incident direction of the third visible light camera 72 is the same with that of the second visible light camera 71. The third visible light camera 72 is disposed at the mounting hole 107 and exposed out of the mounting hole 107. The third visible light camera 72 is also connected to the mainboard 50 through the joint 51. When the first visible light camera 26 is the front-facing camera, the second visible light camera 71 and the third visible light camera 72 form a dual-camera module together, which is a back-facing camera module. When the first visible light camera 26 is the back-facing camera, the second visible light camera 71 and the third visible light camera 72 form a dual-camera module together, which is a front-facing camera module.

As illustrated in FIG. 16 and FIG. 17, in other embodiments, the input/output assembly 200 (the second input/output module 70) further includes a visible-light fill light (or a floodlight) 73 mounted in the mounting hole 107. The floodlight 73 is configured to supplement lights to the second visible light camera 71 and/or the third visible light camera 72. The floodlight 73 is disposed in the receiving hole 821 and located between the second visible light camera 71 and the third visible light camera 72. The floodlight 73 and the second visible light camera 71 may share the same circuit board, which facilitates the floodlight 73 to be mounted in the receiving hole 821. As illustrated in FIG. 4, in other embodiments, the bracket structure 100 further includes a protective cover 822 disposed above the floodlight 73. The protective cover 822 is made of light-transmission materials. For example, the protective cover 822 is made of glass. A light-shielding material (a light-shielding ink) may be arranged (for example, plated) on part of the face of the protective cover 822. The light-shielding material can prevent lights sent out by the floodlight 73 from being directly transmitted to the second visible light camera 71 or the third visible light camera 72.

As illustrated in FIG. 3 and FIG. 12, in some embodiments, the input/output assembly 200 further includes a light guiding module 243. The light guiding module 243 is disposed above the light-sensor body 241 to guide lights to the light sensor 24. In some embodiments, the light guiding module 243 includes a light guiding plate 2431, a light guiding side wall 2432 and a light guiding column 2433. The light guiding side wall 2432 and the light guiding column 2433 are arranged on two opposite sides of the light guiding plate 2431. The light guiding side wall 2432 extends outwards from an edge of the light guiding plate 2431 and the light guiding column 2433 is arranged in a central portion of the light guiding plate 2431. The light guiding plate 2431 and the light guiding side wall 2432 enclose a light guiding chamber 2430 together. The light-sensor body 241 is accommodated in the light guiding chamber 2430. When the first bracket 10, the light sensor 24 and the light guiding assembly 243 are mounted in the accommodating cavity defined by the front housing 30 and the rear housing 40, the light guiding column 2433 and the light guiding hole 44 are coaxial. Lights outside the accommodating cavity can be guided to the light-sensor body 241 through the light guiding column 2433. The light guiding plate 2431 and the light guiding side wall 2432 can guide or reflect lights, such that lights can be guided to the light-sensor body 241.

Figure 18:
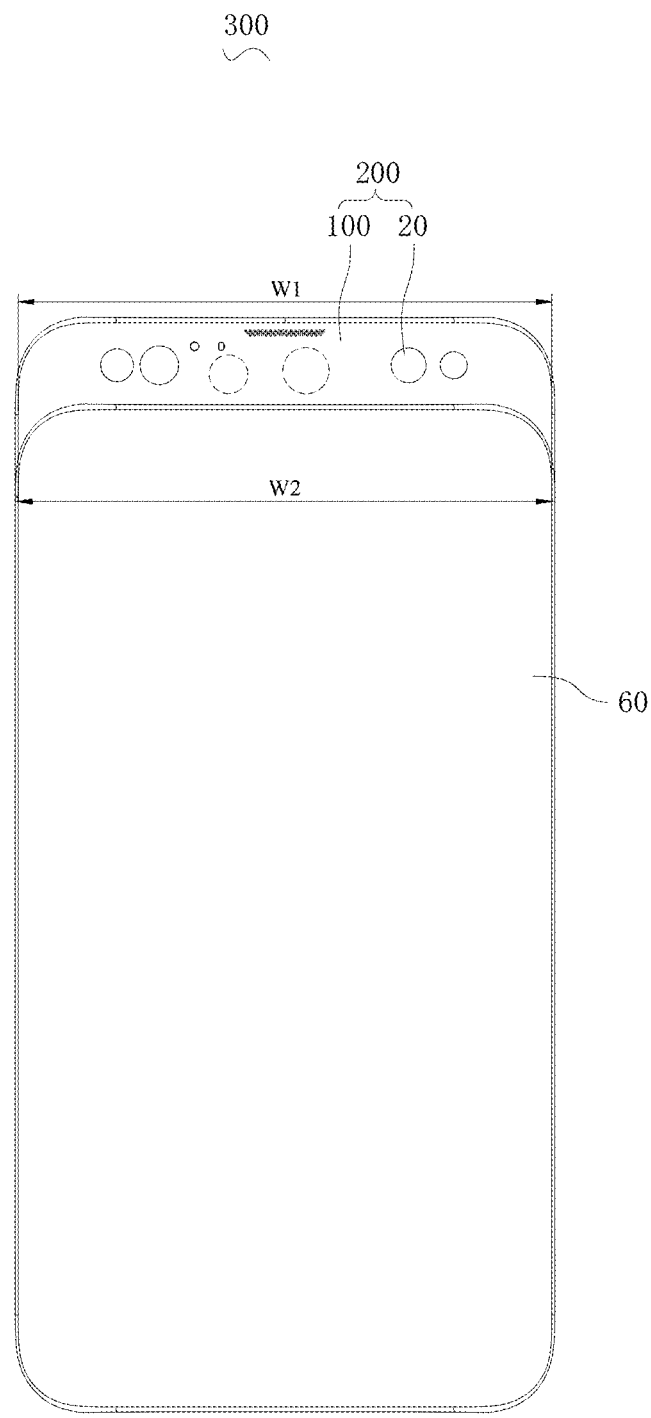
FIGS. 18 and 19 are schematic views of an electronic device according to some embodiments of the present disclosure.

As illustrated in FIG. 18, an electronic device 300 according to embodiments of the present disclosure includes a housing 60 and the input/output assembly 200 according to any one of the above embodiments. The input/output assembly 200 is movably mounted in the housing 60 to selectively expose the first input/output module 20 or hide the first input/output module 20. The electronic device 300 may be a mobile phone, a tablet computer, a laptop, a game console, a head-mounted display, an entrance system, an automatic teller machine and so on.

In some embodiments, a width W1 of the input/output assembly 200 is the same with a width W2 of the housing 60. The housing 60 defines an accommodating space (not illustrated) configured to accommodate the input/output assembly 200. The input/output assembly 200 may be manually moved in the accommodating space. Or, the electronic device 300 further includes a driving assembly (not illustrated). The driving assembly includes a driving motor and thus can drive the input/output assembly 200 to move.

The input/output assembly 200 in the electronic device 300 according to embodiments of the present disclosure may selectively expose the first input/output module 20 or hide the first input/output module 20, and thus there is no need for the first input/output module 20 to be disposed on a face of the housing 60 corresponding to the first face 101. Consequently, a full screen display may be disposed on the face of the housing 60 corresponding to the first face 101.

Figure 19:
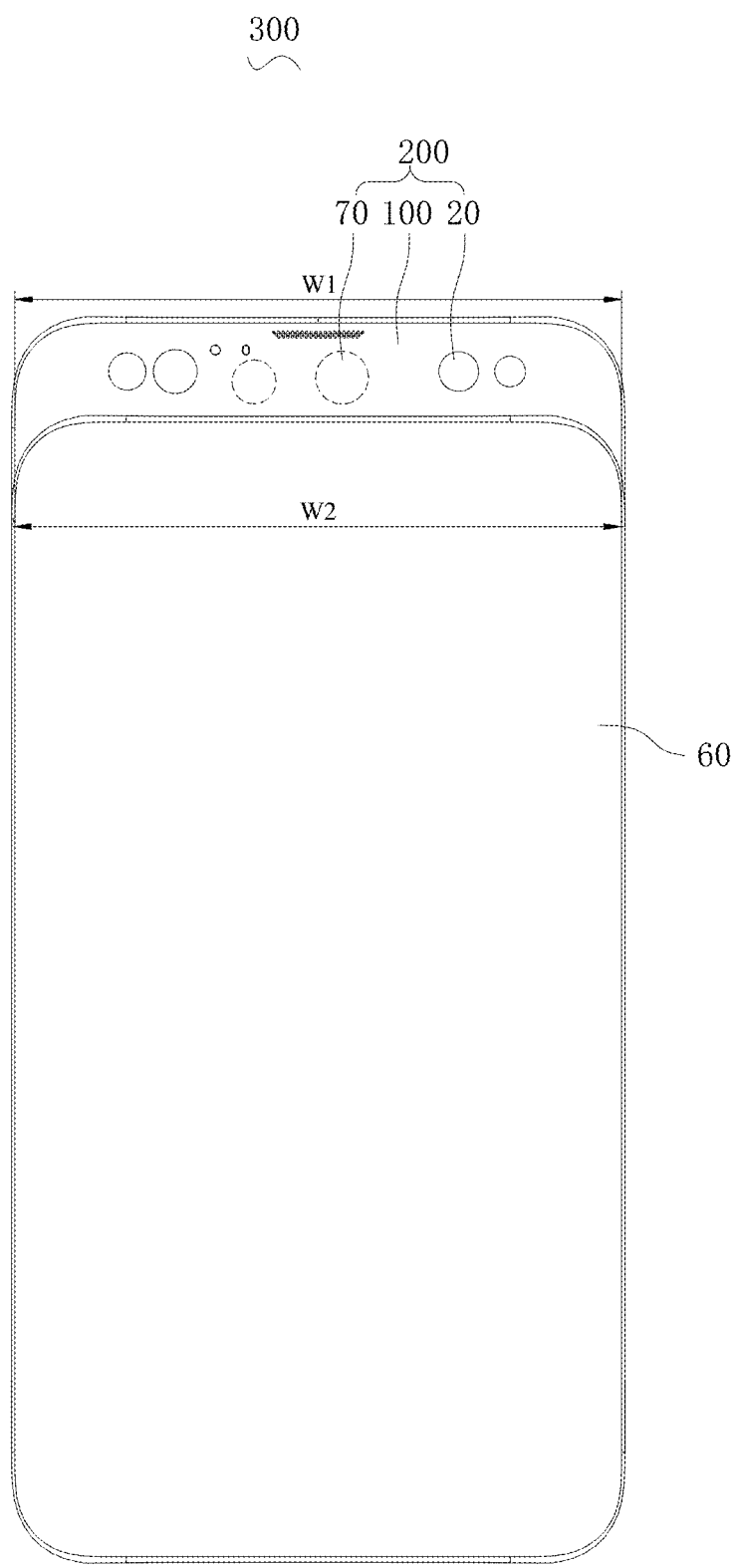

As illustrated in FIG. 19, when the input/output assembly 200 further includes the second input/output module 70, the input/output assembly 200 may be movably mounted in the housing 60 to selectively expose the first input/output module 20 and the second input/output module 70, or hide the first input/output module 20 and the second input/output module 70. In the present embodiment, the input/output assembly 200 in the electronic device 300 may selectively expose the first input/output module 20 and the second input/output module 70, or hide the first input/output module 20 and the second input/output module 70, thus there is no need for the first input/output module 20 and the second input/output module 70 to be disposed on the face of the housing 60 corresponding to the first face 101. Therefore, a full screen display may be disposed on the face of the housing 60 corresponding to the first face 101.

Reference throughout this specification to "some embodiments", "an embodiment", "an exemplary embodiment", "an example", "a specific example", or "some examples" means that a particular feature, structure, material, or characteristic described in connection with the embodiment or example is included in at least one embodiment or example of the present disclosure. In this specification, exemplary descriptions of aforesaid terms are not necessarily referring to the same embodiment or example. Furthermore, the particular features, structures, materials, or characteristics may be combined in any suitable manner in one or more embodiments or examples.

In addition, terms "first" and "second" are merely used to describe an objective, and cannot be construed as indicating or implying relative importance or implicitly indicating a quantity of indicated technical features. Therefore, features that are limited by using "first" and "second" can expressly indicate or implicitly include at least one feature. In the descriptions of the present disclosure, unless otherwise noted, "more" means at least two, for example, two or three.

Although embodiments of present disclosure have been shown and described above, it should be understood that above embodiments are just explanatory, and cannot be construed to limit the present disclosure, for those skilled in the art, changes, alternatives, and modifications can be made to the embodiments without departing from the scope of the present disclosure. The scope of the present disclosure is limited by the attached claims and its equivalents.

What is claimed is:
1. A bracket structure, comprising:
a first bracket;
wherein the first bracket comprises a first face, a second face, and a third face, the first face and the second face are arranged on two opposite sides of the first bracket, the third face is connected to the first face and the second face, the second face is provided with at least two accommodating chambers, the first face is provided with at least two through holes corresponding to the at least two accommodating chambers, the third face is provided with a mounting hole passing through the first face and the second face, the mounting hole is arranged between two of the at least two accommodating chambers;
wherein the first bracket further comprises a fourth face opposite to the third face and connected to the first face and the second face, the at least two accommodating chambers comprise a first chamber, a second chamber, a third chamber and a fourth chamber arranged in sequence, the mounting hole is arranged between the first chamber and the third chamber, the second chamber is arranged between the mounting hole and the fourth face, and the fourth chamber is arranged at a side of the third chamber away from the first chamber.

2. The bracket structure according to claim 1, wherein the first bracket comprises a mounting portion between the mounting hole and the fourth face, and the first bracket further comprises a positioning column protruding from a side of the mounting portion where the first face is.

3. The bracket structure according to claim 2, wherein the mounting portion is provided with an accommodating groove passing through the first face and the second face.

4. The bracket structure according to claim 1, wherein the first bracket comprises a fixing portion between the mounting hole and the fourth face, the fixing portion is provided with the accommodating chamber in a side of the fixing portion where the second face is, and the accommodating chamber is provided with the through hole corresponding to the accommodating chamber in a side of the accommodating chamber where the first face is.

5. The bracket structure according to claim 4, wherein the opening size of the through hole is smaller than that of the accommodating chamber to provide a stop ring, and the accommodating chamber is defined by the stop ring and an inner wall extending around the stop ring.

6. The bracket structure according to claim 4, wherein the bracket structure further comprises a holding part, the accommodating chamber in the fixing portion passes through the third face and the fourth face, and the holding part is mounted in the accommodating chamber to cover an opening in a side of the accommodating chamber where the third face is.

7. The bracket structure according to claim 1, wherein the first bracket has an extension portion at an end thereof, and the first bracket further comprises an engaging column protruding from a side of the extension portion where the first face is.

8. The bracket structure according to claim 1, wherein the bracket structure further comprises a second bracket arranged in the mounting hole, and the second bracket defines a receiving chamber therein.

9. The bracket structure according to claim 8, wherein the first bracket and the second bracket are integrally formed as a single member, or the first bracket and the second bracket are separate members.

10. An input/output assembly, comprising:
a bracket structure comprising a first bracket; and
at least two first input/output modules mounted on the first bracket;
wherein the first bracket comprises a first face, a second face and a third face, the first face and the second face are disposed on two opposite sides of the first bracket, the third face is connected to the first face and the second face, the second face defines at least two accommodating chambers therein, the first face is provided with at least two through holes corresponding to the at least two accommodating chambers, the third face defines a mounting hole therein, the mounting hole passing through the first face and the second face, the mounting hole is disposed between two of the at least two accommodating chambers, and the at least two first input/output modules are disposed in the at least two accommodating chambers and exposed from the first face;
wherein an opening size of the through hole is smaller than that of the corresponding accommodating chamber to provide a stop ring, and the accommodating chamber is defined by the stop ring and an inner wall extending around the stop ring.

11. The input/output assembly according to claim 10, wherein the first input/output module comprises a proximity sensor, the proximity sensor comprises a proximity-sensor circuit board and a proximity-sensor body, the first bracket further comprises a fourth face opposite to the third face and connected to the first face and the second face, the first bracket comprises a mounting portion between the mounting hole and the fourth face, the first bracket further comprises a positioning column protruding from a side of the mounting portion where the first face is, the proximity-sensor circuit board is disposed on the first face at the mounting portion and engaged with the positioning column, and the proximity-sensor body is disposed on a side of the proximity-sensor circuit board opposite to the first face.

12. The input/output assembly according to claim 11, wherein the mounting portion is provided with an accommodating groove passing through the first face and the second face, and the proximity-sensor circuit board passes through the accommodating groove and extends to a side where the second face is.

13. The input/output assembly according to claim 10, wherein the first input/output module comprises a receiver, the receiver comprises a receiver body and a receiver circuit board, the first bracket further comprises a fourth face opposite to the third face and connected to the first face and the second face, the first bracket comprises a fixing portion between the mounting hole and the fourth face, the accommodating chamber is defined in a side of the fixing portion where the second face is, the through hole corresponding to the accommodating chamber is defined in a side of the accommodating chamber where the first face is, and the receiver body is accommodated in the accommodating chamber and carried on the receiver circuit board.

14. The input/output assembly according to claim 10, wherein the first input/output module comprises a fill light, the fill light comprises a fill-light body and a fill-light circuit board, the first bracket has an extension portion at an end thereof, the first bracket further comprises an engaging column protruding from a side of the extension portion where the first face is, the fill-light circuit board is disposed on the first face at the extension portion and engaged with the engaging column, and the fill-light body is disposed on a side of the fill-light circuit board opposite to the first face.

15. The input/output assembly according to claim 14, wherein the first input/output module comprises a light sensor, the light sensor comprises a light-sensor body and a light-sensor circuit board, the first bracket further comprises a fourth face opposite to the third face and connected to the first face and the second face, the first bracket further comprises a clamping column protruding from a side of the extension portion where the fourth face is, the fill-light circuit board is disposed on the fourth face at the extension portion and engaged with the clamping column, and the light-sensor body is disposed on a side of the light-sensor circuit board opposite to the fourth face.

16. The input/output assembly according to claim 10, wherein the first input/output module at least comprises an infrared light source, an infrared camera, a first visible light camera and a receiver, the first bracket further comprises a fourth face opposite to the third face and connected to the first face and the second face, the at least two accommodating chambers comprise a first chamber, a second chamber, a third chamber and a fourth chamber arranged in sequence, the mounting hole is arranged between the first chamber and the third chamber, the second chamber is arranged between the mounting hole and the fourth face, the fourth chamber is arranged on a side of the third chamber away from the first chamber, the first visible light camera is mounted in the third chamber, the receiver is mounted in the second chamber, the infrared camera is mounted in the first chamber, and the infrared light source is mounted in the fourth chamber.

17. The input/output assembly according to claim 10, wherein the input/output assembly further comprises a second input/output module, the bracket structure further comprises a second bracket, the second bracket is arranged in the mounting hole, and the second input/output module is mounted on the second bracket.

18. The input/output assembly according to claim 17, wherein the second bracket comprises a side wall and a separator, the side wall of the second bracket is coupled to the first bracket, the side wall of the second bracket encloses a receiving chamber, the separator is disposed in the receiving chamber and separates the receiving chamber into a first sub-receiving chamber and a second sub-receiving chamber, the second input/output module comprises a second visible light camera and a third visible light camera, and the second visible light camera and the third visible light camera are mounted in the first sub-receiving chamber and the second sub-receiving chamber, respectively.

19. The input/output assembly according to claim 18, wherein a face of the separator on the same side as the second face is provided with a receiving hole, and the second input/output module further comprises a floodlight mounted in the receiving hole.

20. An electronic device, comprising:
a housing;
a bracket structure movably mounted in the housing; and
at least two input/output modules arranged on the bracket structure, and configured to be exposed out of the housing or hidden by the housing when the bracket structure moves in the housing;
wherein the bracket structure comprises a first face, a second face and a third face, the first face and the second face are disposed on two opposite sides of the bracket structure, the third face is connected to the first face and the second face, the second face defines at least two accommodating chambers therein, the first face is provided with at least two through holes corresponding to the at least two accommodating chambers, the third face defines a mounting hole therein, the mounting hole passing through the first face and the second face, the mounting hole is disposed between two of the at least two accommodating chambers, and the at least two input/output modules are disposed in the at least two accommodating chambers and exposed from the first face;
wherein the first bracket further comprises a fourth face opposite to the third face and connected to the first face and the second face, the first bracket comprises a mounting portion between the mounting hole and the fourth face, and the first bracket further comprises a positioning column protruding from a side of the mounting portion where the first face is.

* * * * *